(12) United States Patent
Ikeguchi et al.

(10) Patent No.: US 11,145,532 B2
(45) Date of Patent: Oct. 12, 2021

(54) ELECTROSTATIC CHUCK

(71) Applicant: TOTO LTD., Kitakyushu (JP)

(72) Inventors: Masafumi Ikeguchi, Kitakyushu (JP);
Tetsuro Itoyama, Kitakyushu (JP);
Shuichiro Saigan, Kitakyushu (JP);
Jun Shiraishi, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 16/722,789

(22) Filed: Dec. 20, 2019

(65) Prior Publication Data
US 2020/0203206 A1      Jun. 25, 2020

(30) Foreign Application Priority Data

Dec. 21, 2018   (JP) .............................. JP2018-239399
Sep. 6, 2019    (JP) .............................. JP2019-162983
Dec. 12, 2019   (JP) .............................. JP2019-224435

(51) Int. Cl.
*H01L 21/683* (2006.01)
*H01L 21/687* (2006.01)
*H01L 21/67* (2006.01)
*H01J 37/32* (2006.01)

(52) U.S. Cl.
CPC .... *H01L 21/6833* (2013.01); *H01L 21/68742* (2013.01); *H01J 37/32724* (2013.01); *H01J 2237/002* (2013.01); *H01L 21/67017* (2013.01)

(58) Field of Classification Search
CPC ....................... H01L 21/6833; H01L 21/68742
See application file for complete search history.

(56) References Cited

U.S. PATENT DOCUMENTS

| 4,565,601 | A | * | 1/1986 | Kakehi | ................ C23C 14/541 156/345.27 |
| 5,099,571 | A | * | 3/1992 | Logan | ................. H01L 21/6831 29/825 |
| 5,230,741 | A | * | 7/1993 | van de Ven | ............. C23C 16/04 118/728 |

(Continued)

FOREIGN PATENT DOCUMENTS

| JP | 2005-136104 A | 5/2005 |
| JP | 2011-119708 A | 6/2011 |

(Continued)

*Primary Examiner* — Eric A. Gates
(74) *Attorney, Agent, or Firm* — Carrier Blackman & Associates, P.C.; William D. Blackman; Joseph P. Carrier

(57) ABSTRACT

An electrostatic chuck includes a base plate and a ceramic dielectric substrate. The ceramic dielectric substrate has a first major surface. The first major surface includes at least a first region and a second region. At least one first gas introduction hole is connected to at least one of multiple first grooves. At least one second groove are provided in the first region. The multiple first grooves have substantially circular planar configurations and are provided concentrically. The second groove is connected to at least two of the first grooves. When projected onto a plane perpendicular to a first direction from the base plate toward the ceramic dielectric substrate, at least a portion of the first gas introduction hole overlaps at least one of the first groove or the second groove at a portion where the first groove and the second groove are connected.

11 Claims, 14 Drawing Sheets

(56) References Cited

U.S. PATENT DOCUMENTS

| | | | | |
|---|---|---|---|---|
| 5,238,499 | A * | 8/1993 | van de Ven | C23C 16/04 |
| | | | | 118/724 |
| 5,382,311 | A * | 1/1995 | Ishikawa | C23C 16/4586 |
| | | | | 156/345.54 |
| 5,522,131 | A * | 6/1996 | Steger | H01L 21/6831 |
| | | | | 156/277 |
| 5,578,532 | A * | 11/1996 | van de Ven | C23C 16/04 |
| | | | | 438/584 |
| 5,730,803 | A * | 3/1998 | Steger | C23C 16/4586 |
| | | | | 118/723 R |
| 5,914,568 | A * | 6/1999 | Nonaka | H01L 21/6831 |
| | | | | 315/111.21 |
| 6,215,641 | B1 * | 4/2001 | Busse | H01L 21/6833 |
| | | | | 361/234 |
| 7,913,646 | B2 * | 3/2011 | Kitaoka | C23C 16/4586 |
| | | | | 118/723 R |
| 9,093,488 | B2 * | 7/2015 | Anada | H01L 21/6833 |
| 9,117,633 | B2 * | 8/2015 | Iizuka | H01J 37/3244 |
| 10,249,526 | B2 * | 4/2019 | Parkhe | H01L 21/6875 |
| 10,403,534 | B2 * | 9/2019 | Parkhe | H01L 21/6833 |
| 10,784,139 | B2 * | 9/2020 | Swaminathan | H01L 21/68792 |
| 10,825,660 | B2 * | 11/2020 | Yamaguchi | H01J 37/32724 |
| 2006/0291132 | A1 * | 12/2006 | Kanno | H01L 21/6831 |
| | | | | 361/234 |
| 2009/0086401 | A1 * | 4/2009 | Samir | H01L 21/6831 |
| | | | | 361/234 |

FOREIGN PATENT DOCUMENTS

| | | |
|---|---|---|
| JP | 2012-129547 A | 7/2012 |
| JP | 2013-021151 A | 1/2013 |
| JP | 5462946 B2 | 4/2014 |
| KR | 10-2008-0061108 A | 7/2008 |

\* cited by examiner

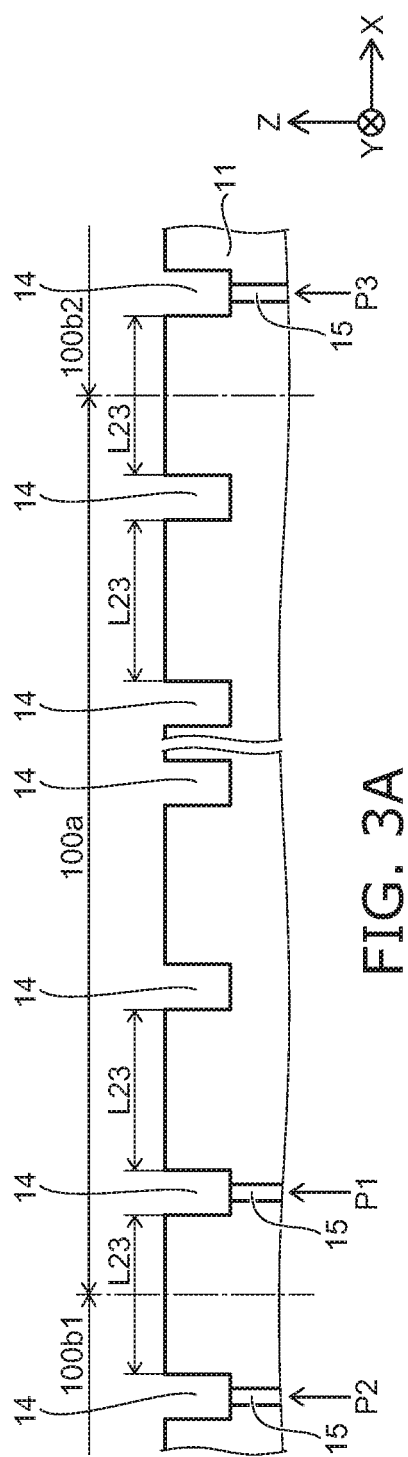
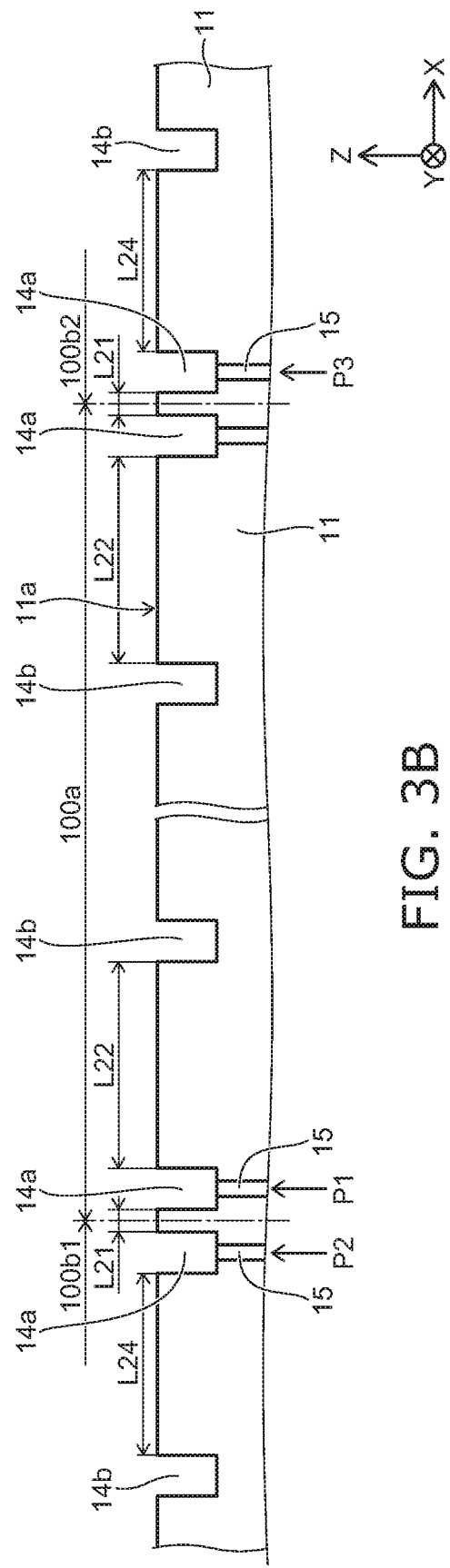

ELECTROSTATIC CHUCK

CROSS-REFERENCE TO RELATED APPLICATIONS

This application is based upon and claims the benefit of priority from Japanese Patent Application No. 2018-239399, filed on Dec. 21, 2018, No. 2019-162983, filed on Sep. 6, 2019, and No. 2019-224435, filed on Dec. 12, 2019; the entire contents of which are incorporated herein by reference.

FIELD

An aspect of the invention relates to an electrostatic chuck.

BACKGROUND

An electrostatic chuck includes, for example, a ceramic dielectric substrate made of alumina or the like, and an electrode provided in the interior of the ceramic dielectric substrate. An electrostatic force is generated when electrical power is applied to the electrode. The electrostatic chuck attracts and holds an object such as a silicon wafer or the like by the generated electrostatic force. In such an electrostatic chuck, the temperature of the object is controlled by causing an inert gas (hereinbelow, called simply the gas) such as helium (He) or the like to flow between the front surface of the ceramic dielectric substrate and the back surface of the object.

For example, in an apparatus such as a CVD (Chemical Vapor Deposition) apparatus, a sputtering apparatus, an ion implantation apparatus, an etching apparatus, or the like which processes a substrate, there are cases where the temperature of the substrate increases in the processing. Therefore, in an electrostatic chuck used in such an apparatus, heat dissipation of the substrate is realized by causing the gas to flow between the ceramic dielectric substrate and the substrate and by causing the gas to contact the substrate.

For example, technology has been proposed in which groove portions having concentric circular configurations and groove portions having radial configurations are provided in the front surface of the ceramic dielectric substrate; and holes for supplying the gas are connected to the radial groove portions.

Also, a temperature distribution occurs in the surface of the object in the processing. In such a case, the temperature of the object can be reduced if the pressure of the gas is increased because the heat dissipation amount from the object increases. Therefore, the in-plane temperature of the object is controlled by subdividing the surface of the ceramic dielectric substrate on the object side into multiple regions and by changing the pressure of the gas in the multiple regions.

For example, technology has been proposed in which sealing rings are provided between the regions to control the pressure of the gas in each region.

In such a case, it is favorable for the regions to be partitioned airtightly by the sealing rings to control the pressure of the gas in each region. However, doing so causes particles occurring in wafer patterning processes to collect easily at the sealing ring portions; and there is a risk of discrepancies in which defects occur at such portions.

Technology also has been proposed in which the pressure of the gas in each region is controlled by providing a slight gap between the object and the top portion of the sealing ring.

In such a case as well, the problem of the particles collecting easily at the sealing ring portions has not been solved.

Therefore, it is desirable to develop technology in which the deposition of the particles at the sealing ring portions can be suppressed while effectively controlling the pressure of the gas in each region.

BRIEF DESCRIPTION OF THE DRAWINGS

FIG. 3A is a schematic cross-sectional view for illustrating the arrangement of the grooves and the arrangement of the gas introduction holes according to a comparative example. FIG. 3B is a schematic cross-sectional view for illustrating an example of the arrangement of the grooves and the arrangement of the gas introduction holes according to the embodiment.

DETAILED DESCRIPTION

Figure 1:
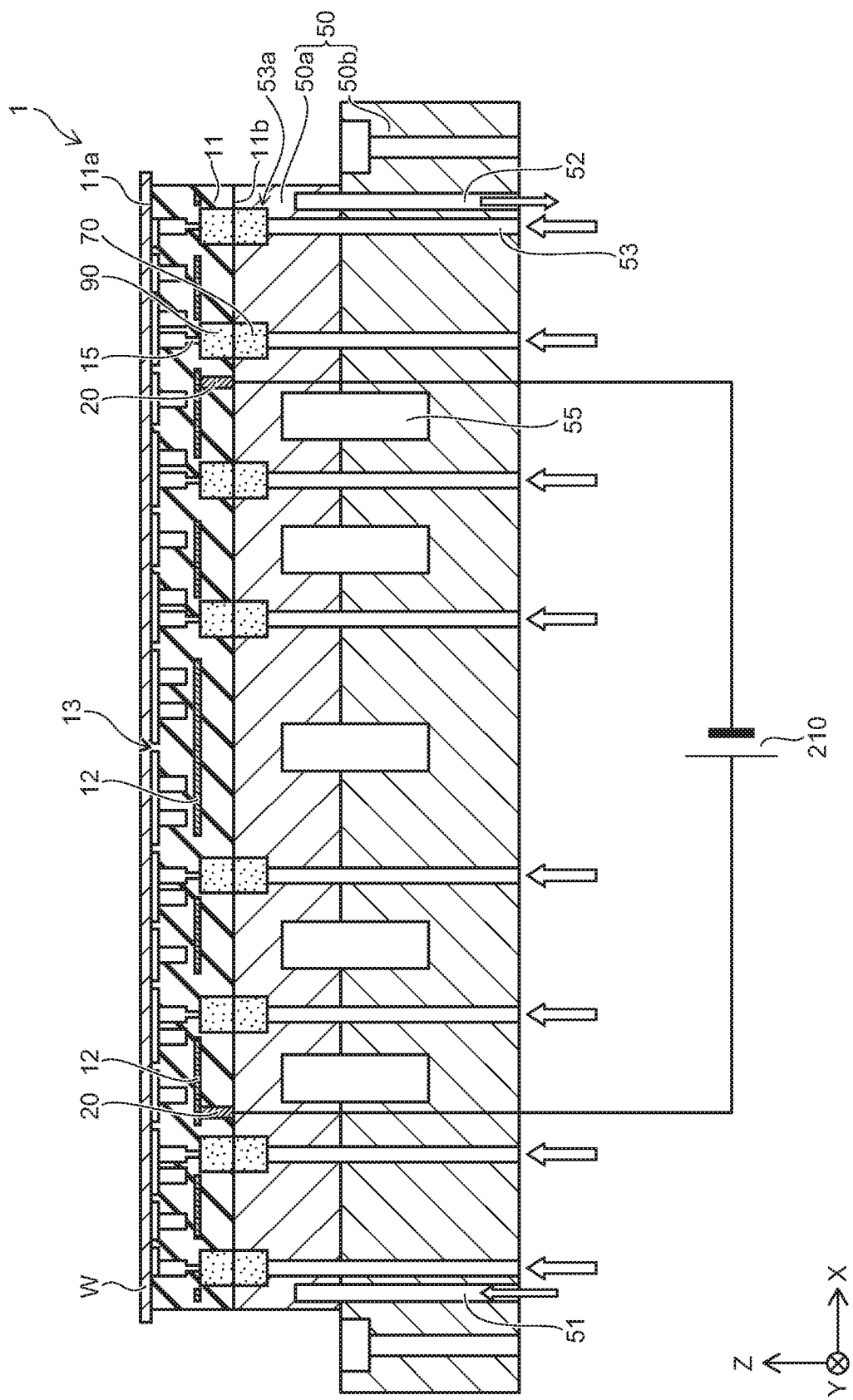
FIG. 1 is a schematic cross-sectional view for illustrating an electrostatic chuck according to the embodiment.

A first invention is an electrostatic chuck including a base plate and a ceramic dielectric substrate; the ceramic dielectric substrate has a substantially circular planar configuration, is provided on the base plate, and has a first major surface exposed externally; the first major surface includes at least a first region (a region 101), and a second region (a region 102) adjacent to the first region; multiple first grooves (grooves 14a and 14b), at least one first gas introduction hole (a gas introduction hole 15) connected to at least one of the multiple first grooves, and at least one second groove (a groove 14c) extending in a direction crossing the multiple first grooves are provided in the first region; the multiple first grooves have substantially circular planar configurations and are provided concentrically; the second groove is connected to at least two of the first grooves; and when projected onto a plane perpendicular to a first direction from the base plate toward the ceramic dielectric substrate, at least a portion of the first gas introduction hole overlaps at least one of the first groove or the second groove at a portion where the first groove and the second groove are connected.

The electrostatic chuck does not include a sealing ring conventionally arranged between the regions to control the pressure of the gas in each region. In other words, when an object W is placed, one enclosed space is formed between the object W and the ceramic dielectric substrate (the first region and the second region). Therefore, the problem of the particles collecting at the sealing ring portions can be solved. On the other hand, if the sealing rings simply are not provided, the splitting of the gas pressure for each region is difficult; and the gas pressure controllability undesirably degrades. Therefore, in the invention, not only are the sealing rings eliminated, but also a contrivance is made so that the groove end portion-end portion distance between a first boundary groove and a second boundary groove is shorter than the groove end portion-end portion distance between the first boundary groove and a first in-region groove adjacent to the first boundary groove.

Also, according to the electrostatic chuck, the region where the intended gas pressure is realized can be large because the region where the pressure of the gas changes at the vicinity of the region-region boundary can be small. Therefore, the pressure of the gas in each region can be effectively controlled while solving the problem of the deposition of the particles.

A second invention is the electrostatic chuck of the first invention, wherein at least two of the second grooves are provided in the first region.

According to the electrostatic chuck, the pressure at a first boundary between the first region and the second region can approach the average value of the pressure in the first region and the pressure in the second region. Therefore, the pressure in each region is maintained more easily at the target pressure.

A third invention is the electrostatic chuck of the first invention, wherein multiple third grooves (the grooves 14a and 14b), at least one second gas introduction hole (gas introduction hole 15) connected to at least one of the multiple third grooves, and at least one fourth groove (the groove 14c) which extends in a direction crossing the multiple third grooves and is connected to at least two of the third grooves are further provided in the second region; the multiple third grooves have substantially circular planar configurations and are provided concentrically with a center of the multiple first grooves as a center; and when projected onto the plane perpendicular to the first direction, at least a portion of the second gas introduction hole overlaps at least one of the third groove or the fourth groove at a portion where the third groove and the fourth groove are connected.

According to the electrostatic chuck, the occurrence of the pressure distribution inside the first region and inside the second region can be suppressed. Also, the time until the pressure inside the first region and the pressure inside the second region reach the prescribed pressures can be shortened drastically, that is, the responsiveness of the gas control and the temperature control can be increased.

A fourth invention is the electrostatic chuck of the third invention, wherein at least two of the fourth grooves are provided in the second region.

According to the electrostatic chuck, the pressure at the first boundary between the first region and the second region can approach the average value of the pressure in the first region and the pressure in the second region. Therefore, the pressure in each region is maintained more easily at the target pressure.

A fifth invention is the electrostatic chuck of the third invention, wherein the second region is provided outward of the first region with respect to a center of the first major surface; and when projected onto the plane perpendicular to the first direction, at least a portion of the first gas introduction hole overlaps at least one of the second groove or an outermost first groove among the first grooves in the first region at a portion where the second groove and the outermost first groove are connected, and at least a portion of the second gas introduction hole overlaps at least one of the fourth groove or an innermost third groove among the third grooves in the second region at a portion where the fourth groove and the innermost third groove are connected.

According to the electrostatic chuck, it is easy to cause the gas supplied from the first gas introduction hole to outflow into at least one of the first groove or the second groove. Therefore, it is easy to obtain the effects described above.

A sixth invention is the electrostatic chuck the third invention, wherein an angle between a first boundary and a line connecting a center of the first gas introduction hole and a center of the second gas introduction hole is less than 90°; and the first boundary is between the first region and the second region.

According to the electrostatic chuck, it is possible for the boundary grooves to be more proximal to each other; and the region where the pressure of the gas changes can be small. Therefore, the region where the intended gas pressure is realized can be large.

A seventh invention is the electrostatic chuck of the third invention, wherein the angle between a first boundary and a line connecting a center of the first gas introduction hole and a center of the second gas introduction hole is 90°; and the first boundary is between the first region and the second region.

According to the electrostatic chuck, the pressure in each region is maintained more easily at the target pressure.

An eighth invention is the electrostatic chuck of the seventh invention, wherein the first region has a lift pin hole provided in the first region; and a distance between the lift pin hole and the outermost first groove is greater than a distance between the lift pin hole and the first groove most proximal to the lift pin hole among the multiple first grooves other than the outermost first groove.

According to the electrostatic chuck, the pressure change inside the region can be reduced.

Embodiments of the invention will now be described with reference to the drawings. Similar components in the drawings are marked with the same reference numerals; and a detailed description is omitted as appropriate.

In each drawing, a direction from a base plate 50 toward a ceramic dielectric substrate 11 is taken as a Z-direction; one direction substantially orthogonal to the Z-direction is taken as a Y-direction; and a direction substantially orthogonal to the Z-direction and the Y-direction is taken as an X-direction.

Electrostatic Chuck

FIG. 1 is a schematic cross-sectional view for illustrating an electrostatic chuck 1 according to the embodiment.

Figure 2:
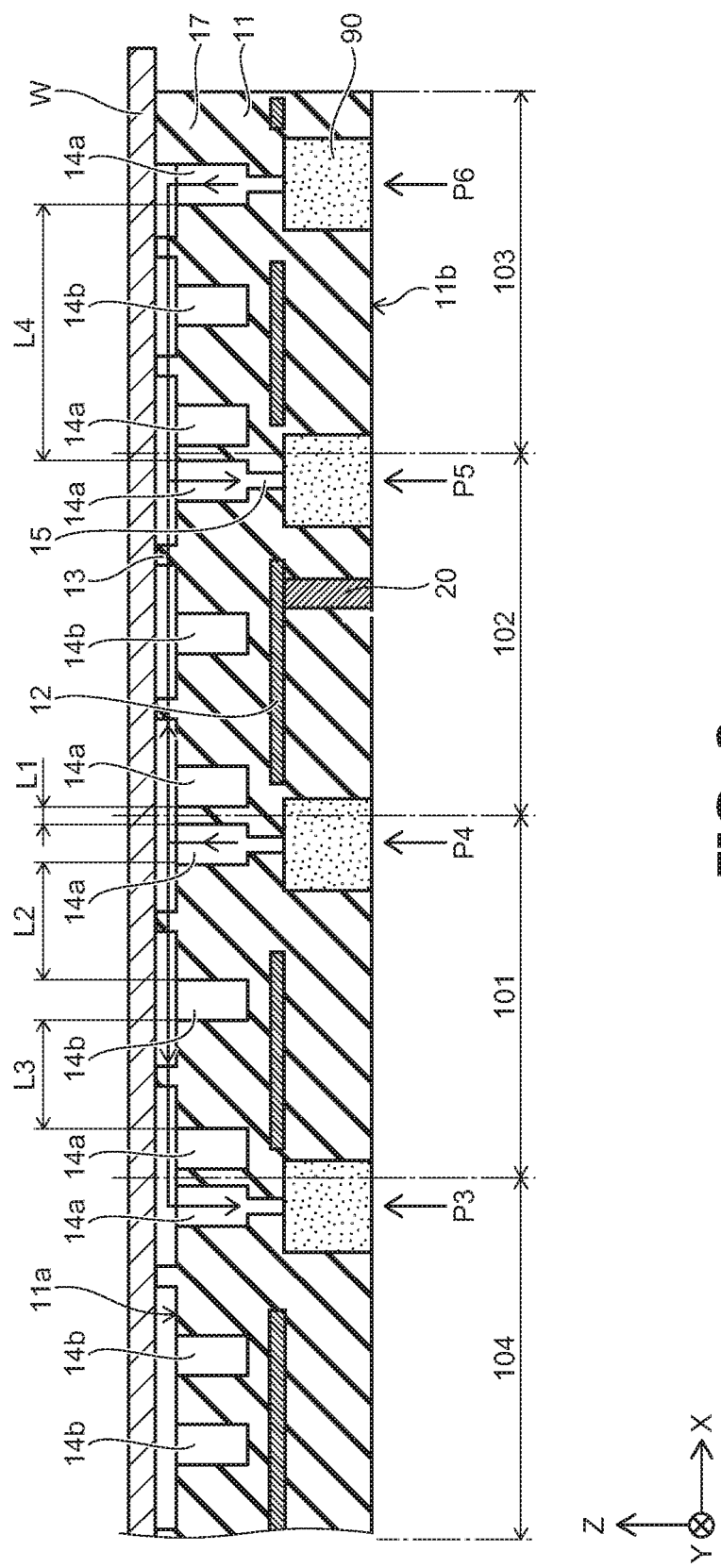
FIG. 2 is a schematic cross-sectional view for illustrating a ceramic dielectric substrate, an electrode, and a first porous portion.

FIG. 2 is a schematic cross-sectional view for illustrating the ceramic dielectric substrate 11, an electrode 12, and a first porous portion 90.

As shown in FIG. 1, the ceramic dielectric substrate 11, the electrode 12, the first porous portion 90, the base plate 50, and a second porous portion 70 can be provided in the electrostatic chuck 1.

As shown in FIG. 1 and FIG. 2, for example, the ceramic dielectric substrate 11 can be a flat-plate shaped member including a sintered ceramic. For example, the ceramic dielectric substrate 11 can include aluminum oxide ($Al_2O_3$). For example, the ceramic dielectric substrate 11 can be formed using high-purity aluminum oxide. The concentration of aluminum oxide in the ceramic dielectric substrate 11 can be, for example, not less than 99 atomic percent (atomic %) and not more than 100 atomic %. The plasma resistance of the ceramic dielectric substrate 11 can be improved by using high-purity aluminum oxide. The porosity of the ceramic dielectric substrate 11 can be, for example, 1% or less. The density of the ceramic dielectric substrate 11 can be, for example, 4.2 $g/cm^3$.

The ceramic dielectric substrate 11 has a first major surface 11a where the chucking object W is placed, and a second major surface 11b on the side opposite to the first major surface 11a. The first major surface 11a is a surface of the electrostatic chuck 1 which is exposed externally. The object W can be, for example, a semiconductor substrate such as a silicon wafer or the like, a glass substrate, etc.

Figure 11:
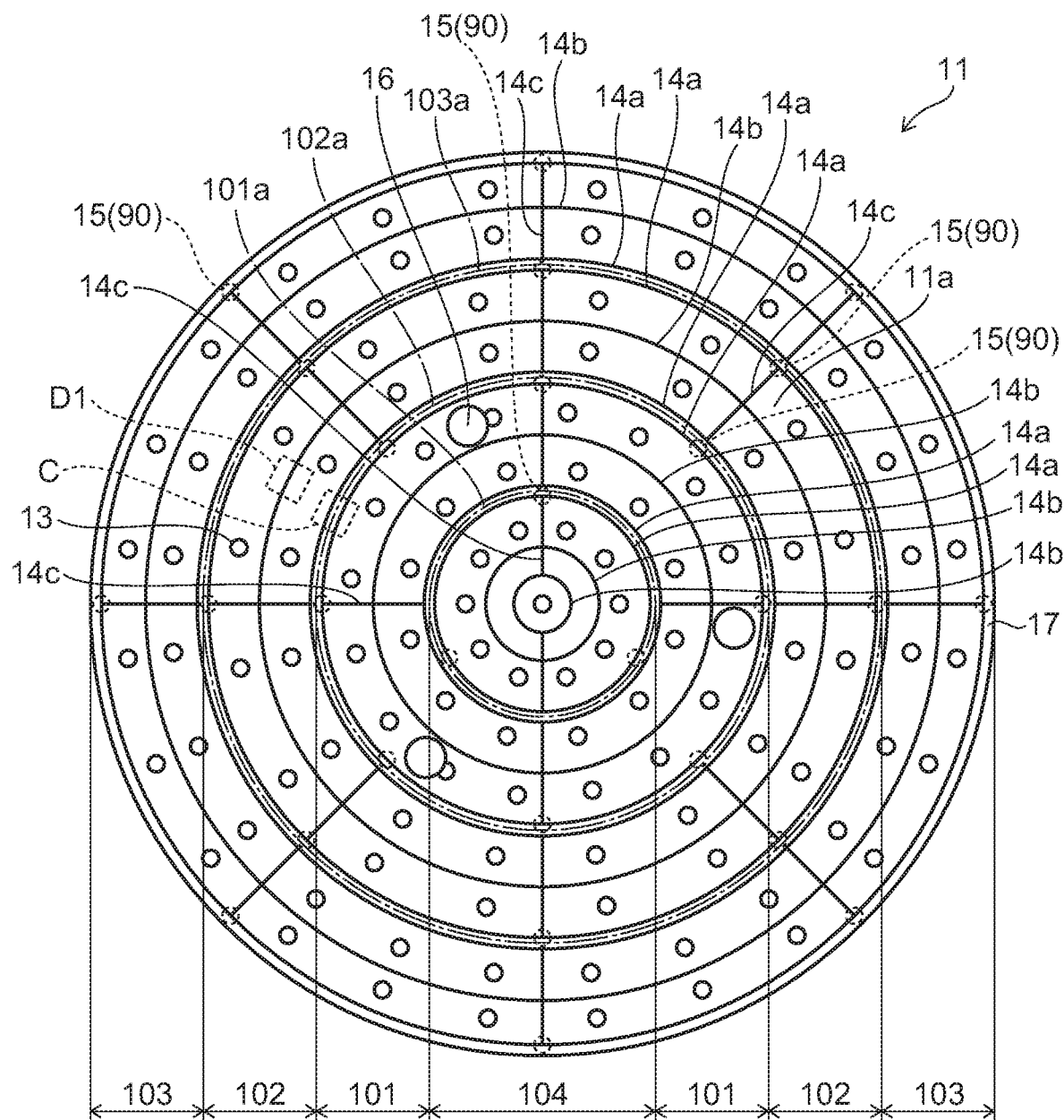
FIG. 11 is a schematic plan view of a ceramic dielectric substrate according to another embodiment.

Multiple raised dots 13 are provided at the first major surface 11a of the ceramic dielectric substrate 11. The raised dots 13 are spaced apart from one another, as shown in FIGS. 2 and 11. The object (workpiece) W is placed on the multiple raised dots 13 and supported by the multiple raised dots 13. By providing the multiple raised dots 13, a space is formed between the first major surface 11a and the back surface of the object W placed on the electrostatic chuck 1. For example, particles that adhere to the object W can be maintained in a favorable state by appropriately selecting the height and the number of the raised dots 13, the surface area ratio and the configuration of the raised dots 13, etc. For example, the heights (the dimensions in the Z-direction) of the multiple raised dots 13 can be set to be not less than 1 μm and not more than 100 μm, favorably not less than 1 μm and not more than 30 μm, and more favorably not less than 5 μm and not more than 15 μm.

The multiple grooves 14a and 14b are provided in the first major surface 11a of the ceramic dielectric substrate 11. The multiple grooves 14a and 14b are open toward the first major surface 11a side of the ceramic dielectric substrate 11. The width (the dimension in the X-direction or the Y-direction) of the groove 14a can be set to, for example, not less than 0.1 mm and not more than 2.0 mm, favorably not less than 0.1 mm and not more than 1.0 mm, and more favorably not less than 0.2 mm and not more than 0.5 mm. The depth (the dimension in the Z-direction) of the groove 14a can be set to, for example, not less than 10 μm and not more than 300 μm, favorably not less than 10 μm and not more than 200 μm, and more favorably not less than 50 μm and not more than 150 μm. The width (the dimension in the X-direction or the Y-direction) of the groove 14b can be set to, for example, not less than 0.1 mm and not more than 1.0 mm. The depth (the dimension in the Z-direction) of the groove 14b can be set to, for example, not less than 0.1 mm and not more than 2.0 mm, favorably not less than 0.1 mm and not more than 1.0 mm, and more favorably not less than 0.2 mm and not more than 0.5 mm.

Multiple gas introduction holes 15 are provided in the ceramic dielectric substrate 11. One end portion of each of the multiple gas introduction holes 15 can be connected to the grooves 14a. The other end portion of each of the multiple gas introduction holes 15 can be connected via the first porous portions 90 to gas supply channels 53 described below. The gas introduction hole 15 is provided from the second major surface 11b to the first major surface 11a. In other words, the gas introduction hole 15 pierces through the ceramic dielectric substrate 11 and extends in the Z-direction between the second major surface 11b side and the first major surface 11a side. The diameter of the gas introduction hole 15 can be set to be, for example, not less than 0.05 mm and not more than 0.5 mm.

Details relating to the multiple grooves 14a and 14b and the multiple gas introduction holes 15 are described below.

The electrode 12 is provided in the interior of the ceramic dielectric substrate 11. The electrode 12 is provided between the first major surface 11a and the second major surface 11b of the ceramic dielectric substrate 11.

For example, the electrode 12 can have a thin-film configuration along the first major surface 11a and the second major surface 11b of the ceramic dielectric substrate 11. The electrode 12 is a chucking electrode for attracting and holding the object W. The electrode 12 may be unipolar or bipolar. The electrode 12 illustrated in FIG. 1 is bipolar; and the electrode 12 that is provided has two poles in the same plane.

A connector 20 is provided at the electrode 12. The electrode 12 and the connector 20 can be formed from a conductive material such as a metal, etc. The end portion of the connector 20 on the side opposite to the electrode 12 side can be exposed at the second major surface 11b side of the ceramic dielectric substrate 11. The connector 20 can be, for example, a via (solid) or a via hole (hollow) conducting to the electrode 12. The connector 20 may be a metal terminal connected by an appropriate method such as brazing, etc.

A power supply 210 is electrically connected to the electrode 12 via the connector 20. A charge can be generated in the region of the electrode 12 on the first major surface 11a side by applying a prescribed voltage to the electrode 12. Therefore, the object W is held to the first major surface 11a side of the ceramic dielectric substrate 11 by an electrostatic force.

The first porous portion 90 is provided in the interior of the ceramic dielectric substrate 11. For example, the first porous portion 90 can be provided at a position opposing the gas supply channel 53 between the base plate 50 and the first major surface 11a of the ceramic dielectric substrate 11 in the Z-direction. For example, the first porous portion 90 can be provided at the gas introduction hole 15 of the ceramic dielectric substrate 11. For example, the first porous portion 90 is inserted into a portion of the gas introduction hole 15.

In the case of the first porous portion 90 illustrated in FIG. 1 and FIG. 2, the first porous portion 90 is provided at the portion of the gas introduction hole 15 at the second major surface 11b side. One end portion of the first porous portion 90 is exposed at the second major surface 11b of the ceramic dielectric substrate 11. The other end portion of the first porous portion 90 is positioned between the first major surface 11a and the second major surface 11b. The other end portion of the first porous portion 90 may be exposed at the bottom surface of the groove 14a. Both end portions of the first porous portion 90 may be positioned between the first major surface 11a and the second major surface 11b.

The material of the first porous portion 90 can be, for example, an insulative ceramic. The first porous portion 90 includes, for example, at least one of aluminum oxide (Al$_2$O$_3$), titanium oxide (TiO$_2$), or yttrium oxide (Y$_2$O$_3$). Thus, the first porous portion 90 can have a high insulation breakdown voltage and a high rigidity.

In such a case, the purity of the aluminum oxide of the ceramic dielectric substrate 11 can be set to be higher than the purity of the aluminum oxide of the first porous portion 90. Thus, the performance such as the plasma resistance, etc., of the electrostatic chuck 1 can be ensured; and the mechanical strength of the first porous portion 90 can be ensured. As an example, a trace amount of an additive is included in the first porous portion 90; thereby, the sintering of the first porous portion 90 is promoted; and it is possible to control the pores and/or ensure the mechanical strength.

For example, the purity of the ceramic such as aluminum oxide, etc., can be measured by X-ray fluorescence analysis, ICP-AES (Inductively Coupled Plasma-Atomic Emission Spectrometry), etc.

As shown in FIG. 1, for example, the base plate 50 supports the ceramic dielectric substrate 11. For example, the ceramic dielectric substrate 11 can be bonded onto the base plate 50. The bonding agent can be, for example, a silicone bonding agent, etc.

For example, the base plate 50 is made of a metal. For example, the base plate 50 is divided into an upper portion 50a and a lower portion 50b made of aluminum; and a connection channel 55 is provided between the upper portion 50a and the lower portion 50b. One end of the connection channel 55 is connected to an input channel 51; and the other end of the connection channel 55 is connected to an output channel 52.

The base plate 50 also performs the role of the temperature adjustment of the dielectric substrate 11. For example, when cooling the dielectric substrate 11, a cooling medium is caused to inflow through the input channel 51, pass through the connection channel 55, and outflow from the output channel 52. Thereby, the heat of the base plate 50 is absorbed by the cooling medium; and the ceramic dielectric substrate 11 which is mounted on the base plate 50 can be cooled. When maintaining the temperature of the dielectric substrate 11, it is also possible to cause a heat-retaining medium to inflow into the connection channel 55. If the temperature of the dielectric substrate 11 can be controlled, it is easy to control the temperature of the object W held by the dielectric substrate 11.

A gas is supplied to the multiple grooves 14a and 14b. The temperature of the object W is controlled by the supplied gas contacting the object W. In such a case, as long as the temperature of the base plate 50 can be controlled, the range of the temperature control by the gas supplied to the grooves 14a and 14b can be small. For example, the temperature of the object W can be roughly controlled by the base plate 50; and the temperature of the object W can be precisely controlled by the gas supplied to the grooves 14a and 14b.

Multiple gas supply channels 53 can be provided in the base plate 50. The gas supply channel 53 can be provided to pierce through the base plate 50. The gas supply channel 53 may not pierce through the base plate 50, and may be provided to reach the ceramic dielectric substrate 11 side by branching partway through other gas supply channels 53.

The gas supply channel 53 is connected to the gas introduction hole 15. In other words, the gas that inflows into the gas supply channel 53 inflows into the gas introduction hole 15 after passing through the gas supply channel 53.

The gas that inflows into the gas introduction hole 15 inflows into the groove 14a to which the gas introduction hole 15 is connected after passing through the gas introduction hole 15. Thereby, the object W can be directly cooled by the gas.

The second porous portion 70 can be provided between the first porous portion 90 and the gas supply channel 53 in the Z-direction. For example, the second porous portion 70 is fitted into the end surface of the base plate 50 on the ceramic dielectric substrate 11 side. As shown in FIG. 1, for example, a countersink portion 53a can be provided in the end surface of the base plate 50 on the ceramic dielectric substrate 11 side; and the second porous portion 70 can be fitted into the countersink portion 53a. The countersink portion 53a is connected to the gas supply channel 53. The second porous portion 70 can be provided to oppose the first porous portion 90.

The multiple grooves 14a and 14b and the multiple gas introduction holes 15 will now be described further. As described above, the temperature of the object W can be controlled by the gas supplied to the multiple grooves 14a and 14b. There are cases where a temperature distribution occurs in the surface of the object W in the processing of the object W. For example, there are cases where a region where the temperature is low and/or a region where the temperature is high occur in the surface of the object W. In such a case, by setting the pressure of the gas contacting the region where the temperature is high to be higher than the pressure of the gas contacting the region where the temperature is low, the heat dissipation amount is high in the region where the temperature is high; therefore, the temperature of the object W can be controlled; and the occurrence of the temperature distribution in the surface of the object W can be suppressed.

For example, the in-plane temperature of the object W can be controlled by subdividing the first major surface 11a side of the ceramic dielectric substrate 11 into multiple regions and by changing the pressure of the gas supplied to the multiple regions. To control the pressure of the gas in each region in such a case, there are examples in which sealing rings are provided between the regions to partition the regions. In such an example, the top portion of the sealing ring contacts the surface of the object W at the first major surface 11a side. Thus, the flow of the gas between the regions can be substantially eliminated; therefore, the pressure of the gas in each region can be effectively controlled.

However, if sealing rings are provided, particles that occur in the wafer patterning processes collect easily at the sealing ring portions; and there is a risk of discrepancies in which defects occur at such portions.

Therefore, in the invention, a contrivance is made for the arrangement of the grooves 14a and 14b without providing the sealing rings for dividing the regions. In other words, when the object W is placed, an enclosed space is formed between the object W and the ceramic dielectric substrate 11 (e.g., the region 101 and the region 102). According to the invention, the pressure control inside the regions can be performed effectively even without sealing rings.

In the invention, it is sufficient for the pressure of the gas in each region to be able to be effectively controlled substantially without providing sealing rings; and it is acceptable for sealing rings to be provided partially or locally. In other words, sealing rings may be provided partially or locally as long as the effect of effectively controlling the pressure of the gas in each region substantially without providing sealing rings is provided.

FIG. 3A is a schematic cross-sectional view for illustrating the arrangement of grooves 14 and the arrangement of the gas introduction holes 15 according to a comparative example.

In FIG. 3A, the grooves 14 are provided at uniform spacing in the X-direction. In other words, a groove end portion-end portion distance L23 is set to be the same along the X-direction.

In the specification, the groove end portion-end portion distance refers to the shortest distance for two adjacent grooves between the inner wall of one groove at the other groove side and the inner wall of the other groove at the one groove side. In such a case, if the groove end portion-end portion distance of the two grooves changes, the shortest distance can be taken as the groove end portion-end portion distance.

A region 100a and a region 100b1 are adjacent in the X-direction; and the region 100a and a region 100b2 are adjacent in the X-direction. In FIG. 3A, the gas introduction holes 15 are connected to the two grooves 14 provided with the boundary between the region 100a and the region 100b1 interposed.

The pressure of the gas supplied to the groove 14 provided in the region 100a is taken as P1; the pressure of the gas supplied to the groove 14 provided in the region 100b1 is taken as P2; and the pressure of the gas supplied to the groove 14 provided in the region 100b2 is taken as P3.

FIG. 3B is a schematic cross-sectional view for illustrating an example of the arrangement of the grooves 14a and 14b and the arrangement of the gas introduction holes 15 according to the embodiment. The grooves 14a are boundary grooves provided with the boundary between different regions interposed; and the grooves 14b are in-region grooves other than the grooves 14a provided inside the region.

In FIG. 3B, the groove end portion-end portion distance (the boundary-groove spacing) of the two grooves 14a (the boundary grooves) provided with the boundary between the region 100a and the region 100b1 or the boundary between the region 100a and the region 100b2 interposed in the X-direction is taken as L21; and the groove end portion-end portion distance (the in-region groove spacing) between the groove 14a (the boundary groove) and the groove 14b (the in-region groove) other than the grooves 14a provided inside the region 100a adjacent to the boundary groove 14a is taken as L22. In such a case, L21<L22. The groove end portion-end portion distance between the groove 14a (the boundary groove) and the groove 14b other than the grooves 14a provided inside the region 100b1 adjacent to the boundary groove 14a is taken as L24; and the groove end portion-end portion distance between the groove 14a (the boundary groove) and the groove 14b other than the grooves 14a provided inside the region 100b2 also is taken as L24.

The pressure of the gas supplied via the gas introduction hole 15 to the groove 14a provided in the region 100a is taken as P1; and the pressure of the gas supplied via the gas introduction hole 15 to the groove 14a provided in the region 100b1 is taken as P2.

Figure 4:
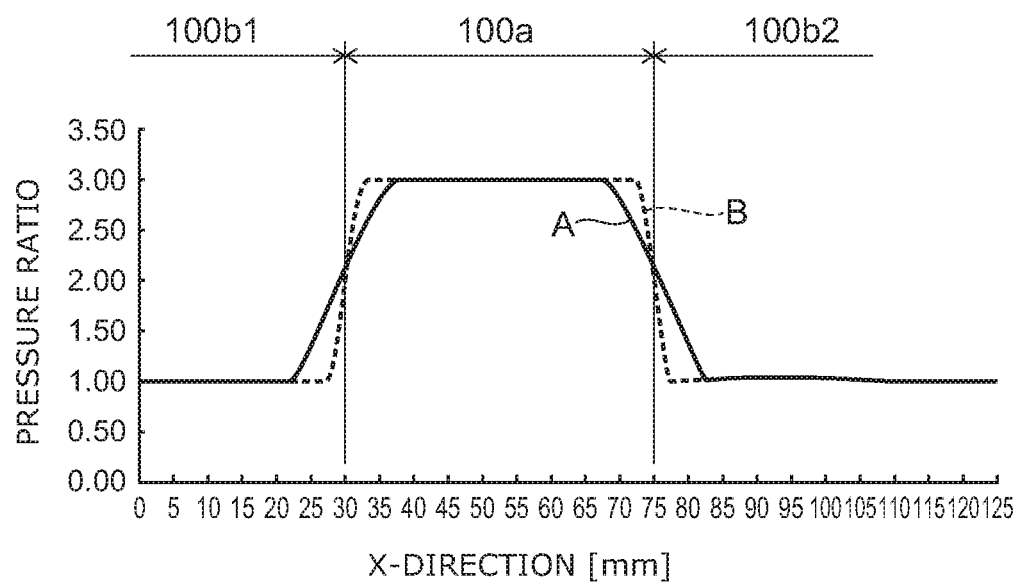
FIG. 4 is a graph of the pressure in the regions and the pressure at the region-region boundaries determined by simulation.

FIG. 4 is a graph determined by simulation of the pressure in the region 100a, the pressures in the regions 100b1 and 100b2, the pressure at the boundary between the region 100a and the region 100b1, and the pressure at the boundary between the region 100a and the region 100b2. In the simulation, it is taken that the object W is supported by the dots 13 above the first major surface 11a of the ceramic dielectric substrate 11.

A in FIG. 4 is an example using the arrangement of the grooves 14 and the arrangement of the gas introduction holes 15 illustrated in FIG. 3A in which the boundary-groove spacing and the in-region groove spacing are equal.

B in FIG. 4 is an example using the arrangement of the grooves 14a and the grooves 14b and the arrangement of the gas introduction holes 15 illustrated in FIG. 3B in which the boundary-groove spacing is smaller than the in-region groove spacing. In either example, sealing rings are not provided between the regions.

In the simulation, P1=3×P2; the groove end portion-end portion distance L21 is set to 5 mm; the groove end portion-end portion distance L22 is set to 20 mm; and the groove end portion-end portion distance L23 is set to 15 mm. The dimension of the region 100a in the X-direction is set to 50 mm.

It can be seen from FIG. 4 that when the boundary-groove spacing and the in-region groove spacing are equal (the case of A), the region where the pressure of the gas changes is large at the vicinity of the boundary between the region 100a and the region 100b1 and at the vicinity of the boundary between the region 100a and the region 100b2. Conversely, when the boundary-groove spacing is smaller than the in-region groove spacing (the case of 8), the region where the pressure of the gas changes at the vicinity of the boundary between the region 100a and the region 100b1 and at the vicinity of the boundary between the region 100a and the region 100b2 can be smaller than those of the case of A. In other words, the region where the intended gas pressure is realized can be increased in each of the region 100a and the regions 100b1 and 100b2; and the uniformity of the gas pressure inside the regions can be increased.

As described above, by adapting the arrangement of the grooves 14a and the grooves 14b, the temperature of the object W can be controlled by the pressure of the gas even without providing sealing rings between the regions. Therefore, if the uniformity of the gas pressure inside the regions can be increased, the temperature of the object W at the portions corresponding to the regions can be more effectively controlled. Also, the occurrence of the in-plane distribution of the temperature of the object W can be suppressed.

According to knowledge obtained by the inventors, it is favorable for the gas introduction hole 15 to be connected to at least one of the two grooves 14a which are the boundary grooves provided with the boundary interposed because the effects described above can be obtained.

In such a case, the gap between the first major surface 11a and the object W has the height of the dots 13; therefore, the gas that is supplied to the groove 14a to which the gas introduction hole 15 is connected is supplied to the grooves 14b and the other grooves 14a via the gap. In other words, in each region, the gas is supplied to the space formed between the back surface of the object W and the first major surface 11a including the grooves 14a and 14b.

It is more favorable when the gas introduction holes 15 are connected respectively to the two grooves 14a provided with the boundary interposed as illustrated in FIG. 3B because the change of the gas pressure at the region boundary can be more pronounced, and because the temperature of the object W can be more effectively controlled. Also, the occurrence of the in-plane distribution of the temperature of the object W can be suppressed more effectively.

Figure 5:
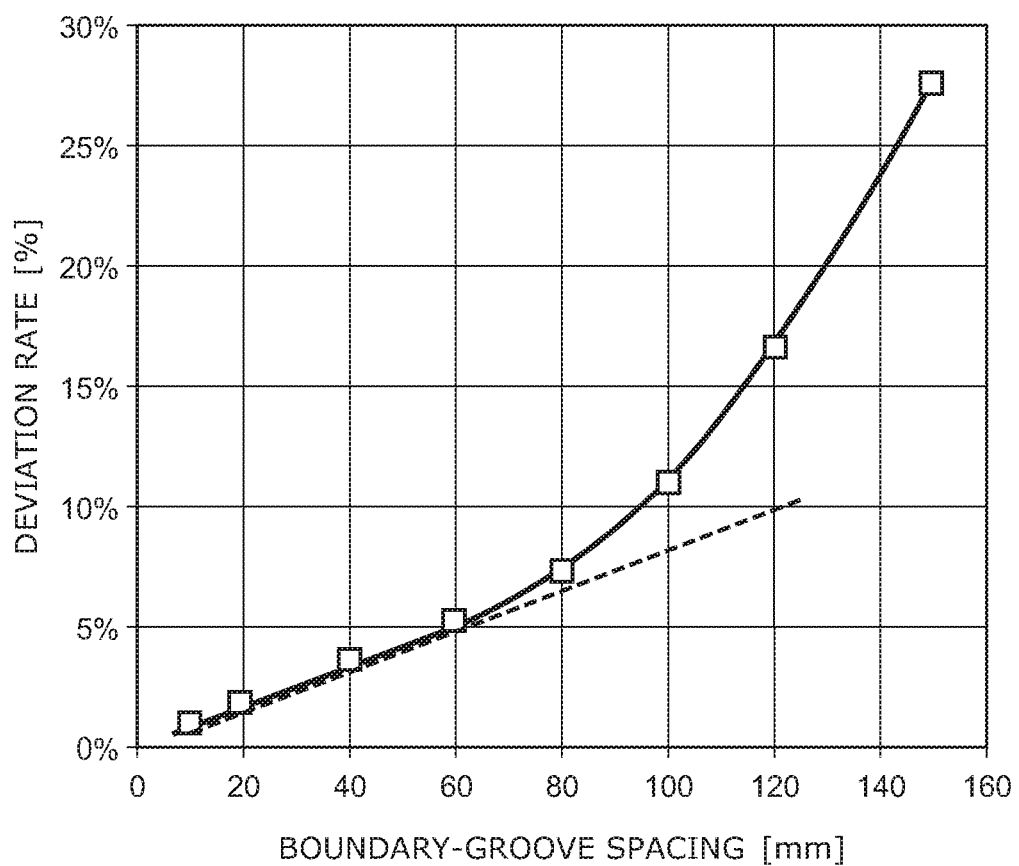
FIG. 5 is a graph for illustrating the effect of the boundary-groove spacing.

FIG. 5 is a graph for illustrating the effect of the boundary-groove spacing.

The boundary-groove spacing of the horizontal axis is the groove end portion-end portion distance of two grooves (boundary grooves) provided with the boundary between adjacent regions interposed. The effect of the boundary-groove spacing is the effect of the boundary-groove spacing itself and is applicable, for example, in the case of the distance L23 illustrated in FIG. 3A or the distance L21 illustrated in FIG. 3B.

The deviation rate of the vertical axis illustrates how much the average pressure in each region deviates from the set pressure (the intended pressure). A large deviation rate shows that the difference between the intended pressure and the average pressure in each region is large.

In FIG. 5, for example, the deviation rate is determined by simulation by setting the pressure P1 in the region 100a of FIGS. 3A and 3B to 20 Torr (2666.4 Pa) and by setting the pressure P3 of the region 100b2 to 60 Torr (7999.2 Pa).

It can be seen from FIG. 5 that the deviation rate increases substantially linearly when the boundary-groove spacing which is the groove end portion-end portion distance of the boundary grooves is greater than 0 mm but not more than 60 mm, and favorably greater than 0 mm but not more than 20 mm. The deviation rate increases exponentially when the boundary-groove spacing is greater than 60 mm. When the boundary-groove spacing is 60 mm or less, and favorably 20 mm or less, the increase of the deviation rate can be suppressed, which means that the average pressure in each region can approach the intended pressure.

As described above, the effect of the boundary-groove spacing is the effect of the boundary-groove spacing itself; therefore, by appropriately combining the contrivance of the arrangement of the grooves 14a and 14b described above, the arrangement of the gas introduction holes 15 (the gas introduction holes 15 connected to the boundary grooves) described above, and the groove 14c described below, the deposition of the particles at the sealing ring portions can be suppressed effectively while controlling the pressure of the gas in each region more effectively.

Figure 6A:
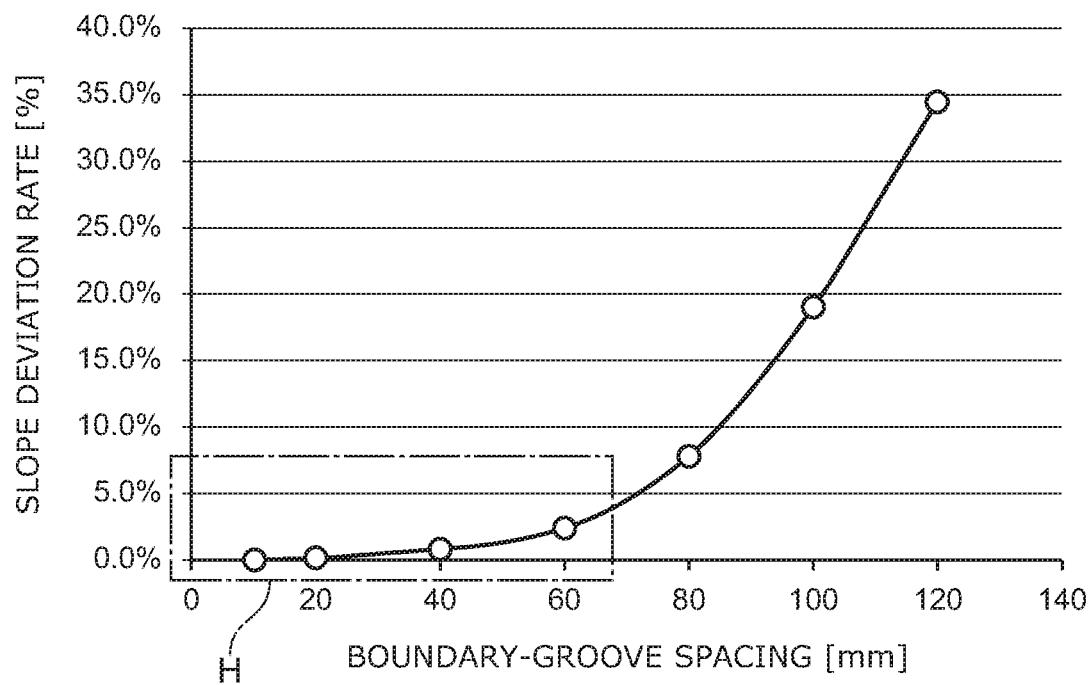
FIG. 6A is a graph for illustrating the effect of the boundary-groove spacing using the "slope deviation rate.

FIG. 6A is a graph for illustrating the effect of the boundary-groove spacing using the "slope deviation rate."

Figure 6B:
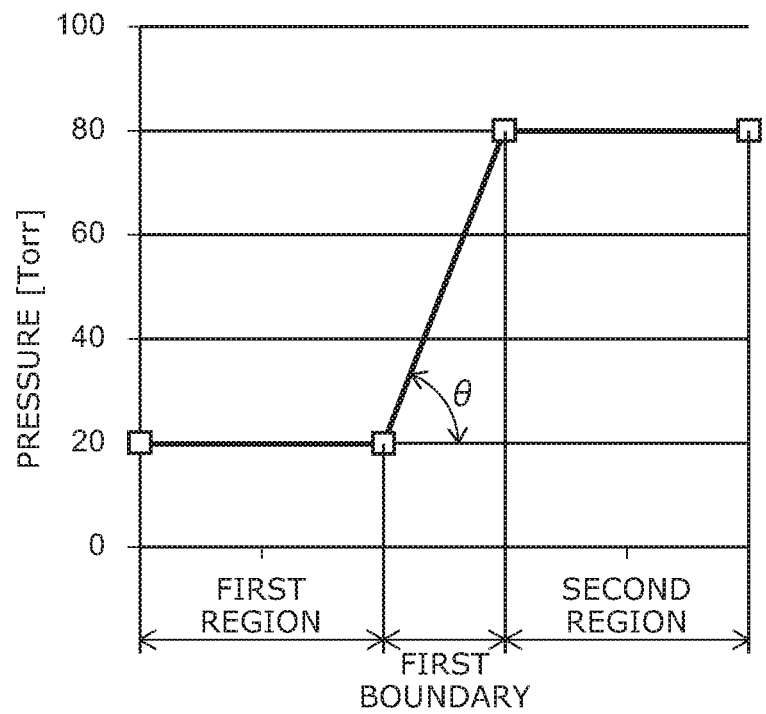
" FIG. 6B is a graph for describing the "slope deviation rate."

FIG. 6B is a graph for describing the "slope deviation rate."

Figure 7:
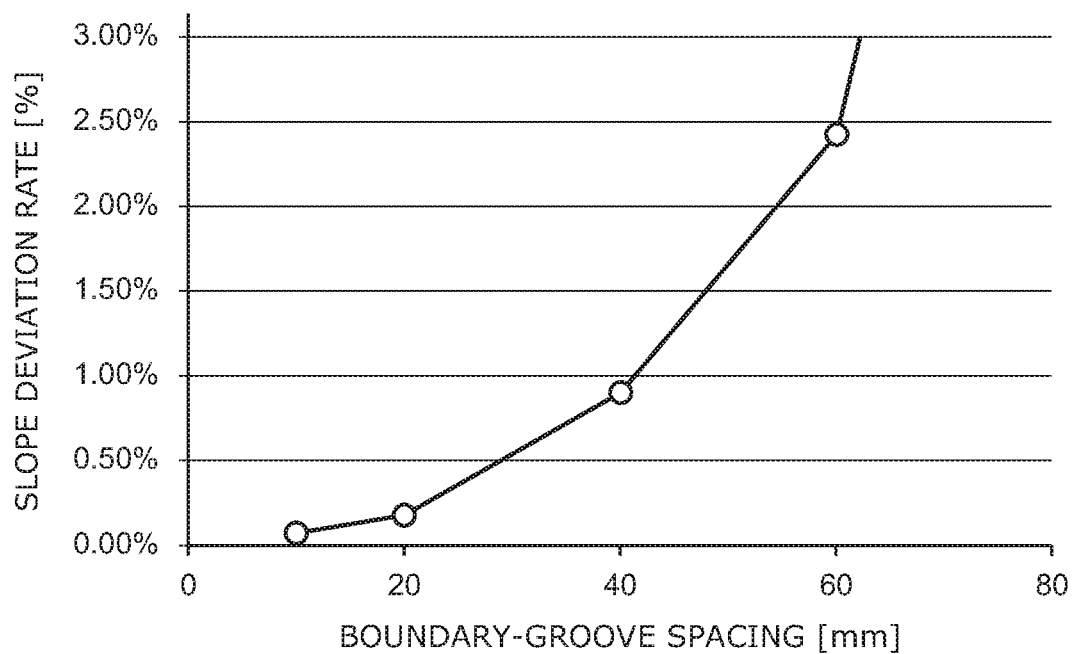
FIG. 7 is an enlarged view of portion H of FIG. 6A.

FIG. 7 is an enlarged view of portion H of FIG. 6A.

If the pressure in the first region and the pressure in the second region are separated ideally, it is considered that the pressure distribution at a first boundary between the first region and the second region has a straight-line distribution (changes linearly) as shown in FIG. 6B. Therefore, the effect of the boundary-groove spacing can be evaluated by arithmetically calculating the slope from the pressure distribution between the regions determined by the analysis and by determining the deviation rate (the slope deviation rate) with respect to the ideal slope.

It can be seen from FIG. 6A that the slope deviation rate increases substantially linearly when the boundary-groove spacing which is the groove end portion-end portion distance of the boundary grooves is greater than 0 mm but not more than 60 mm. The slope deviation rate increases exponentially when the boundary-groove spacing is greater than 60 mm. When the boundary-groove spacing is 60 mm or less, the increase of the slope deviation rate can be suppressed, which means that the average pressure in each region approaches the intended pressure.

It can be seen from FIG. 7 that when the boundary-groove spacing which is the groove end portion-end portion distance of the boundary grooves is greater than 0 mm but not more than 20 mm, the slope deviation rate can be more linear. When the boundary-groove spacing is 20 mm or less, the increase of the slope deviation rate can be suppressed further, which means that the average pressure in each region better approaches the intended pressure.

Figure 8:
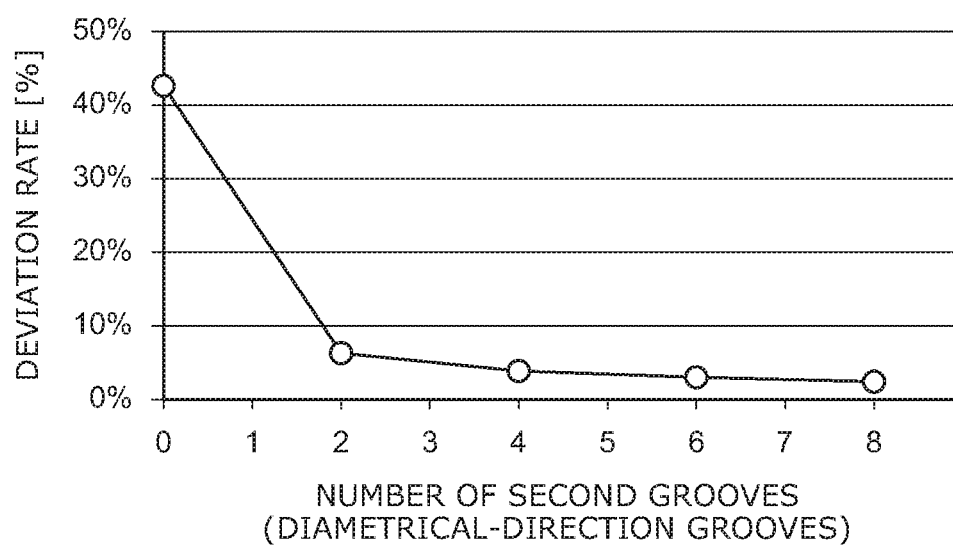
FIG. 8 is a graph for illustrating the effect of the number of second grooves (the grooves 14a and 14b).

FIG. 8 is a graph for illustrating the effect of the number of second grooves (the grooves 14a and 14b (the diametrical-direction grooves)).

It can be seen from FIG. 8 that the deviation rate can be reduced remarkably by providing at least two second grooves in the second region. In other words, the pressure of the first boundary (a boundary 102a) between the first region (the region 101) and the second region (the region 102) can approach the average value of the pressure in the first region and the pressure in the second region. Therefore, the pressure in each region is maintained more easily at the target pressure.

According to knowledge obtained by the inventors, the effects illustrated in FIG. 4 can be obtained if the boundary groove occupancy ratio is larger than the in-region groove occupancy ratio. In other words, if the boundary groove occupancy ratio is larger than the in-region groove occupancy ratio, the region where the pressure of the gas changes at the vicinity of the boundary can be small. Therefore, the temperature of the object W can be effectively controlled because the region where the intended gas pressure is realized can be large. Also, the occurrence of the in-plane distribution of the temperature of the object W can be suppressed.

Figure 9A:
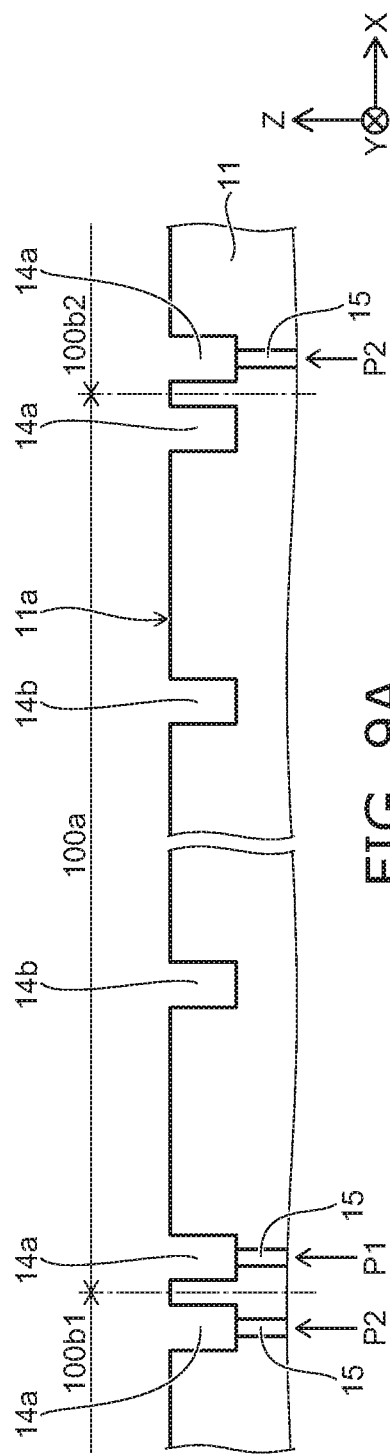
FIG. 9A is a schematic cross-sectional view for illustrating the arrangement of the gas introduction holes.

FIG. 9A is a schematic cross-sectional view for illustrating the arrangement of the gas introduction holes 15.

In FIG. 9A, the region 100a and the region 100b1 are adjacent in the X-direction; and the region 100a and the region 100b2 are adjacent in the X-direction. Also, two grooves 14a (boundary grooves) are provided with the boundary between the region 100a and the region 100b1 interposed in the X-direction; and two grooves 14a (boundary grooves) are provided with the boundary between the region 100a and the region 100b2 interposed in the X-direction. Also, the grooves 14b (the in-region grooves) are provided in the interior of the region 100a and the interiors of the regions 100b1 and 100b2. In the region 100a, the gas introduction hole 15 is connected to the groove 14a at the region 100b1 side; but the gas introduction hole 15 is not connected to the groove 14a at the region 100b2 side. In the region 100b1, the gas introduction hole 15 is connected to the groove 14a at the region 100a side. In the region 100b2, the gas introduction hole 15 is connected to the groove 14a at the region 100a side. In other words, the gas introduction hole 15 is connected to only one groove 14a in the region 100a.

The pressure of the gas supplied to the groove 14a provided in the region 100a is taken as P1; and the pressure of the gas supplied to the grooves 14a provided in the regions 100b1 and 100b2 is taken as P2.

Figure 9B:
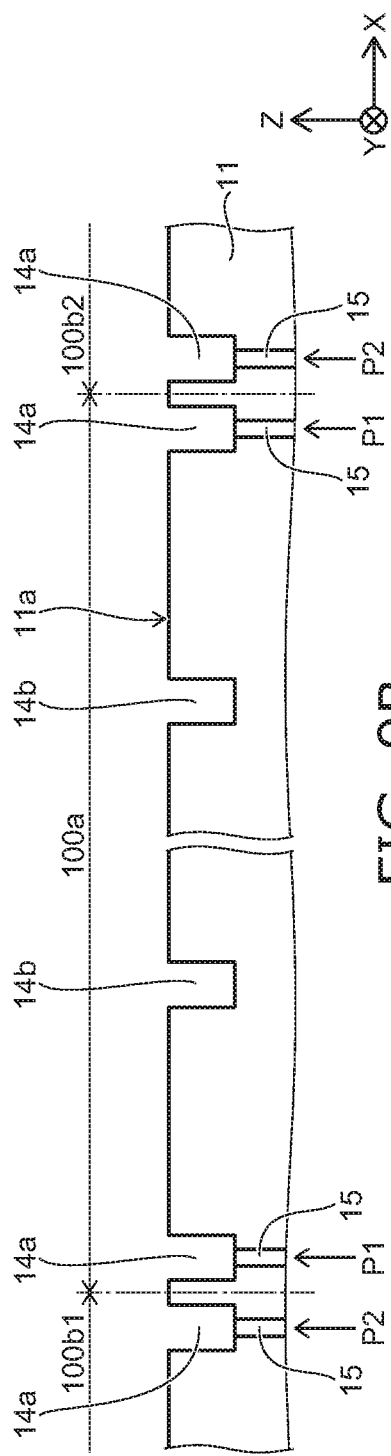
FIG. 9B is a schematic cross-sectional view for illustrating the arrangement of the gas introduction holes according to another embodiment.

FIG. 9B is a schematic cross-sectional view for illustrating the arrangement of the gas introduction holes 15 according to another embodiment.

In FIG. 9B, the gas introduction holes 15 are connected to the groove 14a at the region 100b1 side and the groove 14a at the region 100b2 side in the region 100a.

The pressure of the gas supplied to the grooves 14a provided in the region 100a is taken as P1; and the pressure of the gas supplied to the grooves 14a provided in the regions 100b1 and 100b2 is taken as P2.

Figure 10A:
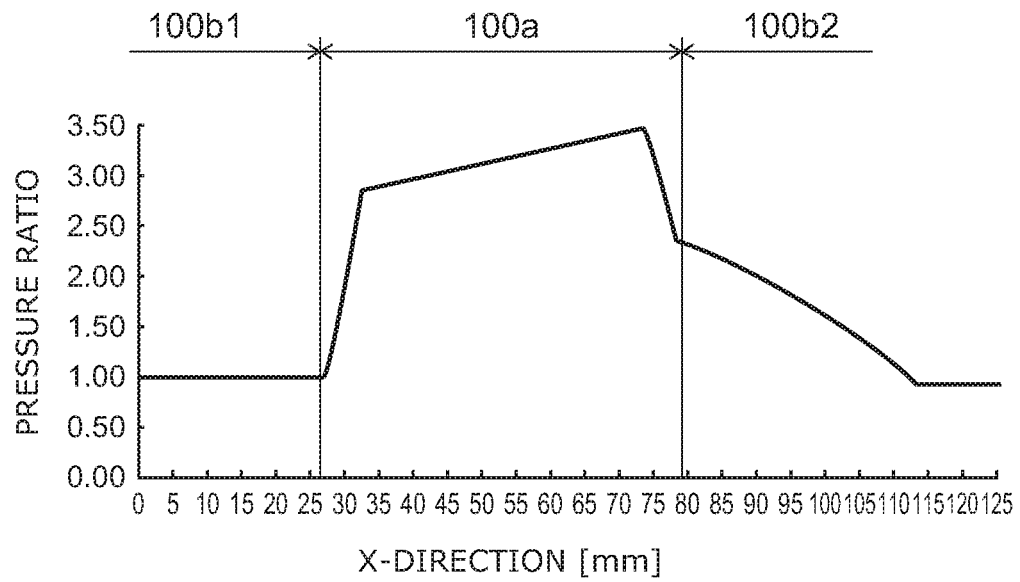
FIGS. 10A and 10B are graphs of the pressure in the regions and the pressure at the region-region boundary determined by simulation.
Figure 10B:
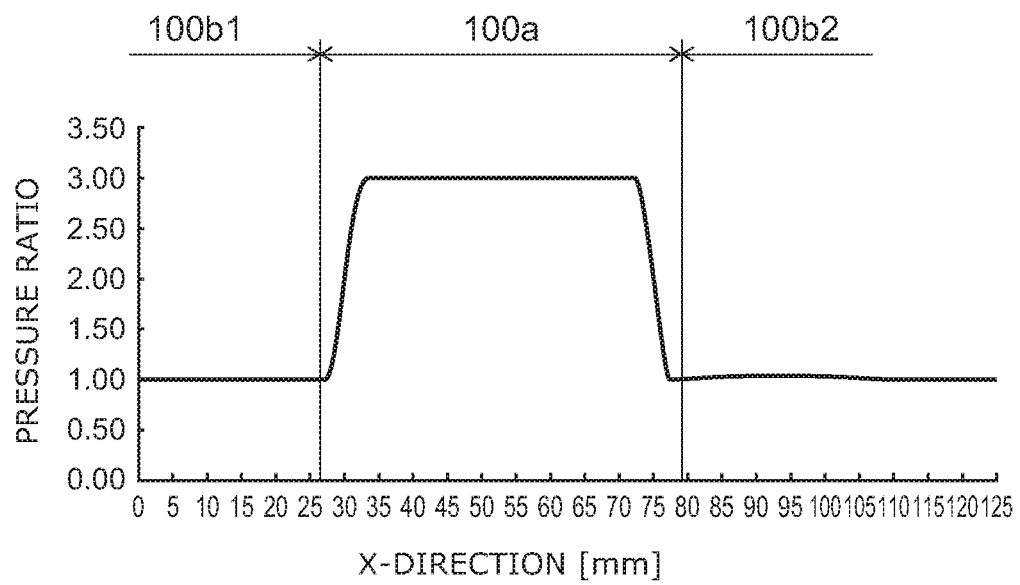

FIGS. 10A and 10B are graphs in which the pressure in the region 100a, the pressures in the regions 100b1 and 100b2, the pressure at the boundary between the region 100a and the region 100b1, and the pressure at the boundary between the region 100a and the region 100b2 are determined by simulation. In the simulation, the object W is supported by the dots 13 above the first major surface 11a of the ceramic dielectric substrate 11.

FIG. 10A is the case of FIG. 9A.

FIG. 10B is the case of FIG. 9B.

The dimension of the region 100a in the X-direction is set to 50 mm; and P1=3×P2.

As shown in FIG. 9A, the gas introduction hole 15 is not connected to the groove 14a at the region 100b2 side of the region 100a; therefore, it can be seen from FIG. 10A that the region where the pressure of the gas changes at the vicinity of the boundary is large. Therefore, the region where the intended gas pressure is realized is small.

Conversely, the gas introduction hole 15 is connected to the groove 14a at the region 100b1 side of the region 100a; therefore, it can be seen from FIG. 10B that the region where the pressure of the gas changes at the vicinity of the boundary is small. Therefore, the region where the intended gas pressure is realized can be large.

It can be seen from FIG. 10B that it is more favorable for the gas introduction holes 15 to be connected to the two grooves 14a provided with the boundary interposed because the region where the intended gas pressure is realized can be increased further.

As described above, the temperature of the object W can be controlled by the pressure of the gas. Therefore, the temperature of the object W can be effectively controlled if the region where the intended gas pressure is realized can be increased. Also, the occurrence of the in-plane distribution of the temperature of the object W can be suppressed. As described above, it is favorable for the gas introduction hole 15 to be connected to the groove 14a (the boundary groove). It is more favorable for the gas introduction holes 15 to be connected to the two grooves 14a provided with the boundary interposed. In the example shown in FIG. 9B, two gas introduction holes 15 are provided in the region 100a. For example, both of the two gas introduction holes 15 may be linked to one gas supply channel 53 (referring to FIG. 1).

When the gas introduction holes 15 are connected respectively to the two grooves 14a provided with the boundary interposed, the angle between the boundary and a line connecting the center of the gas introduction hole 15 connected to one groove 14a and the center of the gas introduction hole 15 connected to the other groove 14a can be less than 90°. In such a case, for example, the angle can be set to be not less than 1.0° and not more than 89°, favorably not less than 2.0° and not more than 70°, and more favorably not less than 3.0° and not more than 60°.

Thus, it is possible for the boundary grooves to be more proximal to each other; and the region where the pressure of the gas changes can be small. Therefore, the region where the intended gas pressure is realized can be large.

The angle between the boundary and the line connecting the center of the gas introduction hole 15 connected to the one groove 14a and the center of the gas introduction hole 15 connected to the other groove 14a also can be 90°.

In such a case, the angle is not exactly 90°; for example, differences within the manufacturing fluctuation levels are tolerable.

Thus, by arranging the two gas introduction holes 15 at counter positions, the gases of different pressures supplied from the two gas introduction holes 15 compete. Therefore, the pressure in each region is maintained more easily at the target pressure.

FIG. 11 is a schematic plan view of the ceramic dielectric substrate 11 according to another embodiment. FIG. 11 is a schematic plan view of the ceramic dielectric substrate 11 described in FIG. 2.

As shown in FIG. 11, multiple grooves 14c can be further provided in the first major surface 11a of the ceramic dielectric substrate 11. The width of the groove 14c (the dimension in a direction substantially perpendicular to the extension direction of the groove) can be set to, for example, not less than 0.1 mm and not more than 1 mm. The depth (the dimension in the Z-direction) of the groove 14c can be set to, for example, not less than 50 µm and not more than 150 µm.

In the example, at least one groove 14c is provided in each of the regions 101, 102, and 104. The groove 14c connects the multiple grooves 14a and 14b provided in one region. Therefore, the gas that is supplied to the groove 14a to which the gas introduction hole 15 is connected flows along the groove 14a and is supplied to the grooves 14b and the other grooves 14a via the groove 14c. By providing the groove 14c, the flow of the gas can be smooth; therefore, even without sealing rings, the occurrence of a pressure distribution in the region can be suppressed. Also, the gas can be supplied to the grooves 14b and the other grooves 14a via the groove 14c even when the top portions of the dots 13 wear and the gap between the object W and the first major surface 11a becomes narrow.

The groove 14c is disposed to link the grooves 14a and the grooves 14b. For example, the groove 14c can extend in a direction crossing the grooves 14a and 14b.

For example, as shown in FIG. 11, multiple grooves 14c can be provided on a line passing through the center of the ceramic dielectric substrate 11. It is not always necessary to provide the multiple grooves 14c on a line passing through the center of the ceramic dielectric substrate 11. Although grooves 14c having linear configurations are illustrated, as long as the grooves 14c can link the grooves 14a and the grooves 14b, the grooves 14c can have curved configurations, or portions having linear configurations and portions having curved configurations. The number, the arrangement, the configurations, etc., of the multiple grooves 14c can be modified as appropriate according to the size of the object W, the required specification of the temperature distribution of the object W, etc. For example, the number, the arrangement, the configurations, etc., of the multiple grooves 14c can be determined as appropriate by performing experiments and/or simulations.

In an aspect of the invention in which the sealing ring is not provided, a contrivance is made to increase the responsiveness of the gas pressure inside the region. As an example, the gas pressure inside the region can be effectively controlled by providing the groove 14c linking the grooves 14a and the grooves 14b.

Because the gap between the first major surface 11a and the object W has the height of the dots 13, the gas that is supplied to the groove 14a to which the gas introduction hole 15 is connected is supplied to the grooves 14b and the other grooves 14a via the gap. However, when the top portions of the dots 13 wear and the gap between the object W and the first major surface 11a becomes narrow, there is a risk that the flow of the gas inside each region may be obstructed; and a pressure distribution may occur. By providing the groove 14c, the gas can be supplied to the grooves 14b and/or the other grooves 14a via the groove 14c even when the top portions of the dots 13 wear and the gap between the object W and the first major surface 11a becomes narrow. Therefore, the time until the pressure inside the region reaches the prescribed pressure can be shortened drastically; and the occurrence of the pressure distribution inside the region can be suppressed.

As shown in FIG. 11, at least two gas introduction holes 15 (first gas introduction hole) configured to supply the gas can be provided in the region 101 (first region), that is, the groove 14a (first boundary groove) extending along the boundary 102a, which is provided in the most vicinity of the boundary 102a (first boundary) between the region 101 and the region 102 (second region).

Recently, a high density of the semiconductor integrated circuit is further increased, and a plasma density is also increased in order to realize further fine processing. When a hole diameter of the gas introduction hole 15 is made small to suppress arching under the high density plasma, individual gas introduction holes may have an individual difference due to manufacturing variation or the like. According to the embodiment, the effect of hole size variation of the individual gas introduction holes can be suppressed, and a prescribed amount of gas can be certainly supplied to the groove 14a extending along the boundary 102a.

As shown in FIG. 11, at least two gas introduction holes 15 (second gas introduction hole) configured to supply the gas can be provided in the region 102, that is, the groove 14a (second boundary groove) extending along the boundary 102a, which is provided in the most vicinity of the boundary 102a. In the example shown in FIG. 10, three gas introduction holes are provided.

In this way, as well as the previous description, the effect of hole size variation of the individual gas introduction holes can be suppressed, and a gas can be certainly supplied to the groove 14a extending along the boundary 102a.

Effects of the groove 14c will now be described further.

Figure 12A:
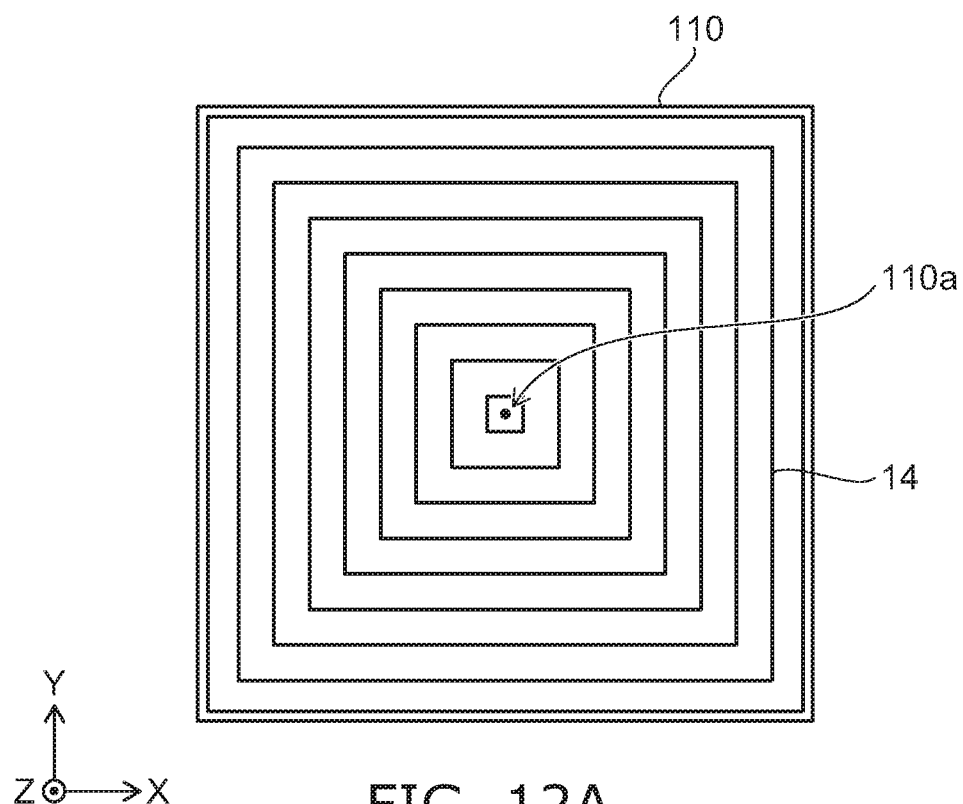
FIG. 12A is a schematic plan view for illustrating the arrangement of the grooves according to a comparative example.

FIG. 12A is a schematic plan view for illustrating the arrangement of the grooves 14 according to a comparative example.

In FIG. 12A, the multiple grooves 14 are provided in the front surface of a substrate 110. The multiple grooves 14 have ring configurations and are provided at uniform spacing in concentric configurations with a center 110a of the substrate 110 as the center. The groove 14c is not provided in FIG. 12A.

Figure 12B:
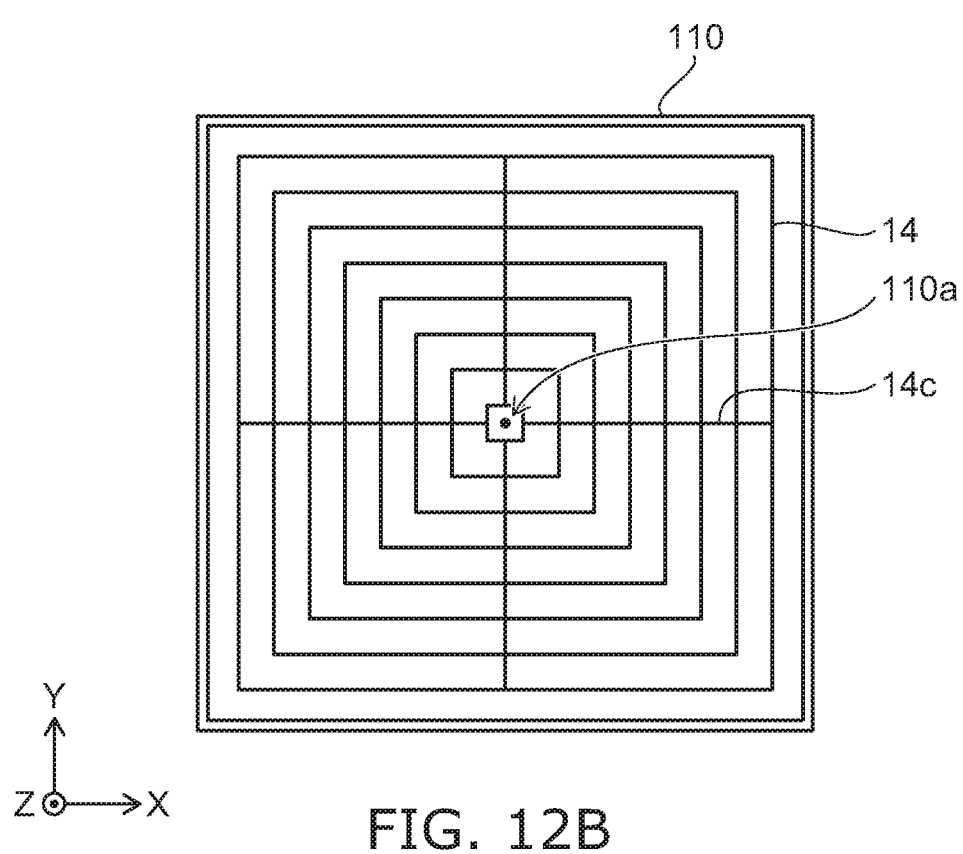
FIG. 12B is a schematic plan view for illustrating the arrangement of the grooves.

FIG. 12B is a schematic plan view for illustrating the grooves 14c and the arrangement of the grooves 14.

In FIG. 12B, the multiple grooves 14 are provided; and the multiple grooves 14c are provided to link at least a portion of the multiple grooves 14 to each other. In the example, the grooves 14c are provided on lines passing through the center 110a of the substrate 110. The multiple grooves 14 are connected to each other by the grooves 14c.

Figure 13:
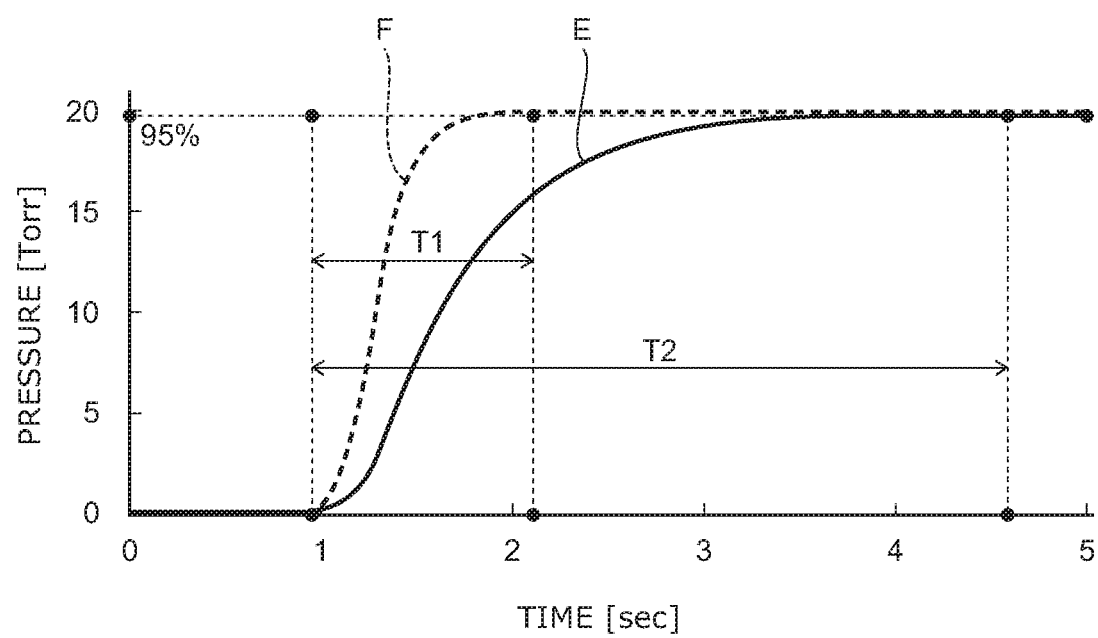
FIG. 13 is a graph for illustrating the pressure change at the center of the substrate.

FIG. 13 is a graph for illustrating the pressure change at the center 110a of the substrate 110. FIG. 13 is a graph of the pressure change at the center 110a of the substrate 110 determined by simulation. In the simulation, the object W is supported by the dots 13 above the substrate 110.

E in FIG. 13 is the case where the multiple grooves 14 illustrated in FIG. 12A are provided.

F in FIG. 14 is the case where the multiple grooves 14c and the multiple grooves 14 illustrated in FIG. 12B are provided.

It can be seen from FIG. 13 that the pressure in the case illustrated in FIG. 12A (the case of E) could increase only to 95% of the prescribed pressure (20 Torr). This means that a pressure distribution may occur inside the region.

The pressure in the case illustrated in FIG. 12B (the case of F) could increase to the prescribed pressure (20 Torr). This means that the occurrence of the pressure distribution inside the region can be suppressed.

Also, a time T1 necessary for increasing to the prescribed pressure in the case of F was shorter than a time T2 necessary for increasing to 95% of the prescribed pressure in the case of E. This means that the time until the pressure inside the region reaches the prescribed pressure can be shortened drastically, that is, the responsiveness of the gas control and even the temperature control can be increased.

As described above, it is favorable for the gas introduction hole 15 to be connected to at least one of the two grooves 14a provided with the boundaries 101a to 103a interposed.

For example, as illustrated in FIG. 11, for the regions 101, 102, and 104 which are inward in the first major surface 11a, the gas introduction hole 15 can be connected to the outermost groove 14a in each region. In the region 103 which is the outermost region of the first major surface 11a, the gas introduction hole 15 can be connected to the innermost groove 14a.

The number, the arrangement, etc., of the gas introduction holes 15 provided in each region can be modified as appropriate according to the size of the object W, the required specification of the temperature distribution of the object W, etc. For example, as illustrated in FIG. 11, three gas introduction holes 15 can be provided at uniform spacing in one region. In such a case, at least one of the multiple gas introduction holes 15 provided in the region 103 and the gas introduction hole 15 provided in the region 102 can be provided on a line passing through the center of the first major surface 11a.

Although the case is described above where the region where the pressure of the gas changes at the vicinity of the boundary is reduced, considering the supply of the gas to the grooves 14a and 14c provided in the regions, it is favorable for the gas introduction hole 15 to be provided at a position where the groove 14a and the groove 14c cross or at the vicinity of such a position. For example, when projected onto a plane perpendicular to the Z-direction, at least a portion of the gas introduction hole 15 can overlap at least one of the groove 14a or the groove 14c at the portion where the groove 14a and the groove 14c are connected. Thus, it is easy to cause the gas supplied to the groove 14a to outflow toward the groove 14c. Therefore, it is easy to obtain the effects of the groove 14c described above.

Figure 14A:
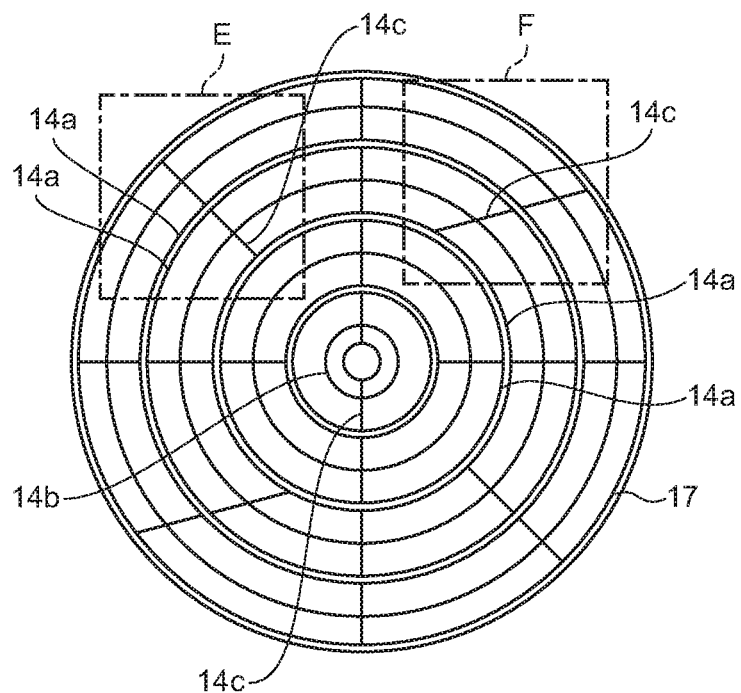
FIGS. 14A to 14C are schematic views for illustrating the form of a groove 14c.
Figure 14B:
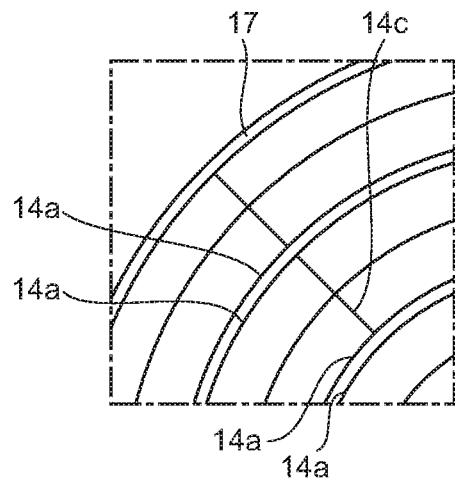
Figure 14C:
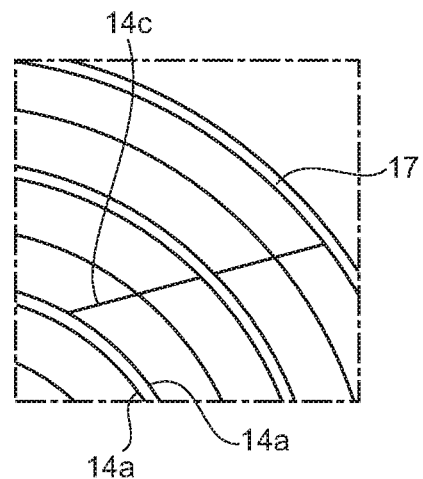

FIGS. 14A to 14C are schematic views for illustrating a form of the groove 14c.

FIG. 14B is an enlarged view of portion E of FIG. 14A.

FIG. 14C is an enlarged view of portion F of FIG. 14A.

As shown in FIG. 14B, for example, the groove 14c can be provided to overlap a line drawn from the center of the ceramic dielectric substrate 11 toward the outer perimeter. In such a case, the angle between the groove 14c and the tangent of the groove 14a can be 90° at the portion where the groove 14a and the groove 14c are connected.

Also, as shown in FIG. 14C, for example, the groove 14c may not overlap a line drawn from the center of the ceramic dielectric substrate 11 toward the outer perimeter. In such a case, the angle between the groove 14c and the tangent of the groove 14a is not 90° at the portion where the groove 14a and the groove 14c are connected.

Figure 15:
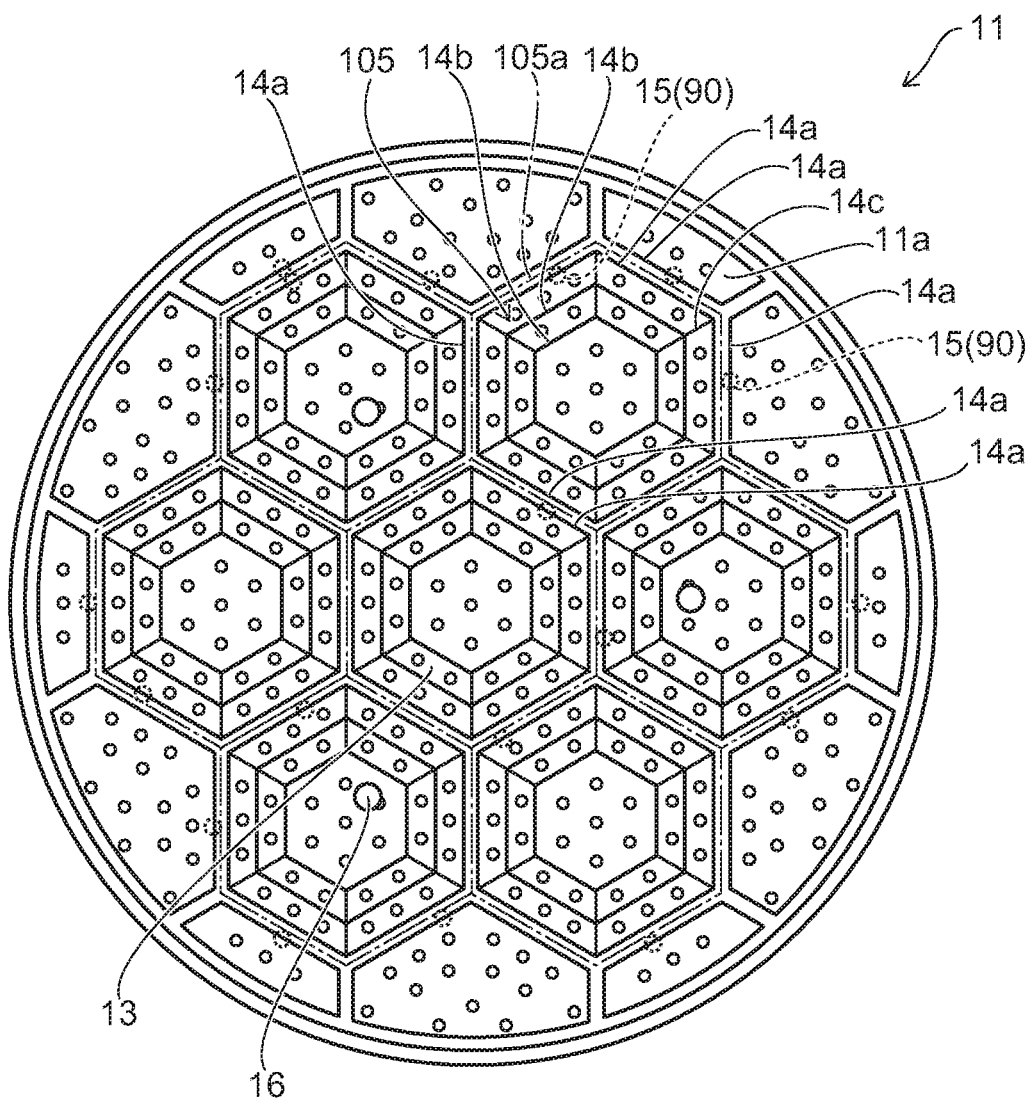
FIG. 15 is a schematic plan view of a ceramic dielectric substrate according to another embodiment.

FIG. 15 is a schematic plan view of the ceramic dielectric substrate 11 according to another embodiment.

In the cases illustrated in FIG. 11, the first major surface 11a is subdivided into the multiple regions 101 to 104 having concentric circular configurations. Conversely, in the case illustrated in FIG. 15, the first major surface 11a is subdivided into multiple regions 105 which closely contact each other. The multiple regions 105 can be arranged with each other. Although the exterior configurations of the multiple regions 105 are not particularly limited, it is favorable to use configurations which can be in close contact with each other. For example, the multiple regions 105 can be polygons such as triangles, quadrilaterals, etc. The exterior configuration of the region 105 illustrated in FIG. 15 is a regular hexagon. The exterior configurations, the number, the arrangement, etc., of the multiple regions 105 can be modified as appropriate according to the size of the object W, the required specification of the temperature distribution of the object W, etc. For example, the exterior configurations, the number, the arrangement, etc., of the multiple regions 105 can be determined as appropriate by performing experiments and/or simulations.

The grooves 14a are provided along a boundary 105a of the region 105. The grooves 14a are provided with the boundary 105a interposed. At least one groove 14b is provided inside the region 105. The groove 14b can be provided concentrically with the groove 14a. The number, the positions, etc., of the grooves 14b provided in one region can be modified as appropriate according to the size of the object W, the required specification of the temperature distribution of the object W, etc. For example, the number, the positions, etc., of the grooves 14b provided in one region can be determined as appropriate by performing experiments and/or simulations.

Otherwise, the groove 14c, the gas introduction hole 15, the dot 13, the lift pin hole 16, the outer seal 17, etc., can be provided similarly to those described above.

Processing Apparatus

Figure 16:
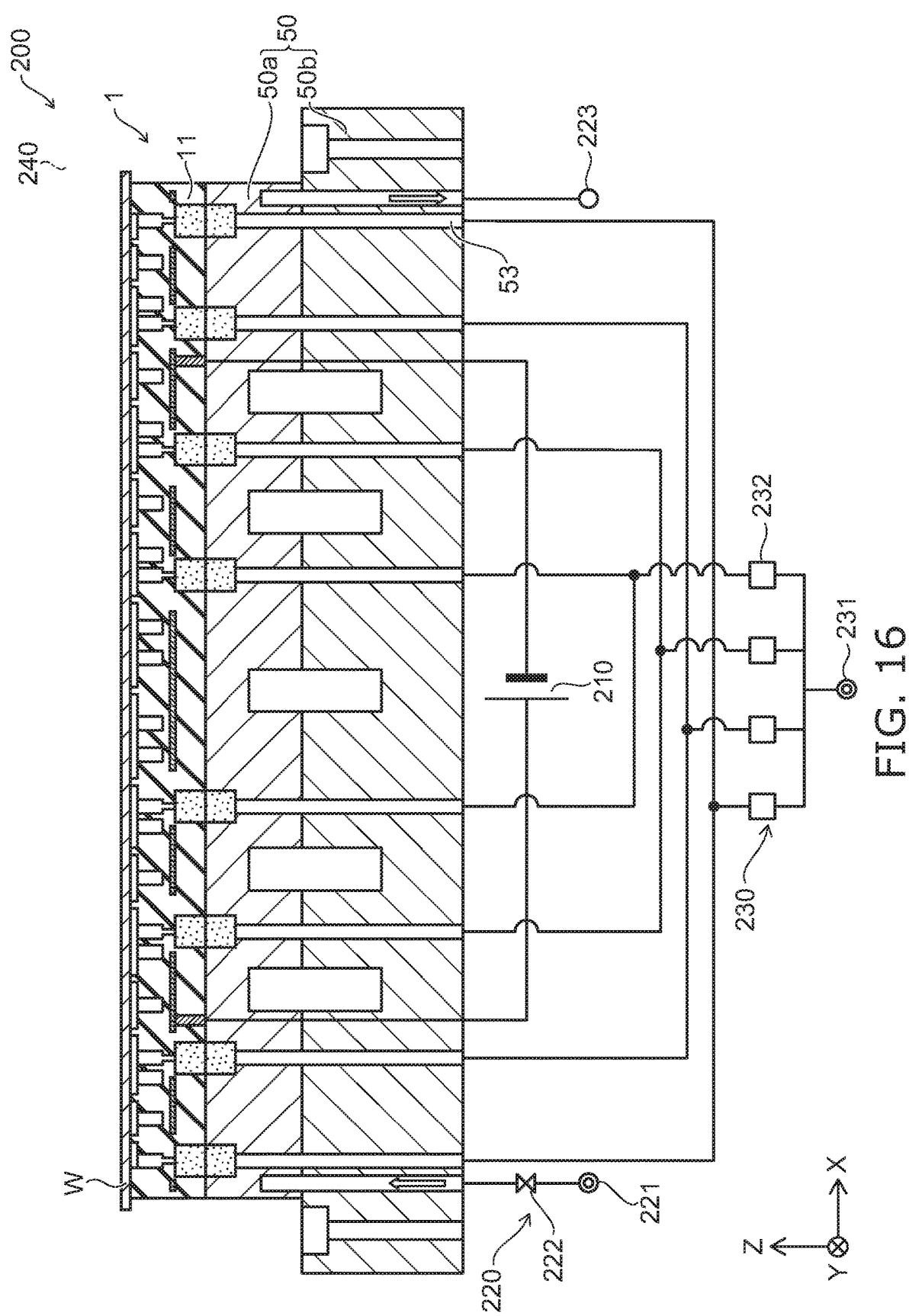
FIG. 16 is a schematic view for illustrating a processing apparatus according to the embodiment.

FIG. 16 is a schematic view for illustrating a processing apparatus 200 according to the embodiment.

As shown in FIG. 16, the electrostatic chuck 1, the power supply 210, a medium supplier 220, and a supplier 230 can be provided in the processing apparatus 200.

The power supply 210 is electrically connected to the electrode 12 provided in the electrostatic chuck 1. The power supply 210 can be, for example, a direct current power supply. The power supply 210 applies a prescribed voltage to the electrode 12. A switch that switches between the application of the voltage and the cutoff of the application of the voltage also can be provided in the power supply 210.

The medium supplier 220 is connected to the input channel 51 and the output channel 52. For example, the medium supplier 220 can supply a liquid used as a cooling medium or a heat-retaining medium.

The medium supplier 220 includes, for example, a container 221, a control valve 222, and a discharger 223.

For example, the container 221 can be a tank containing the liquid, factory piping, etc. A cooling apparatus and/or a heating apparatus that controls the temperature of the liquid can be provided in the container 221. A pump for supplying the liquid, etc., also can be included in the container 221.

The control valve 222 is connected between the input channel 51 and the container 221. The control valve 222 can control at least one of the flow rate or the pressure of the liquid.

The control valve 222 also may be able to switch between the supply of the liquid and the cutoff of the supply of the liquid.

The discharger 223 is connected to the output channel 52. The discharger 223 can be a tank, a drain pipe, etc., recovering the liquid discharged from the output channel 52. The discharger 223 is not always necessary; and the liquid that is discharged from the output channel 52 may be supplied to the container 221. Thus, resource conservation can be realized by circulating the cooling medium or the heat-retaining medium.

The supplier 230 includes a gas supplier 231 and a gas controller 232.

The gas supplier 231 can be a high-pressure cylinder storing gas such as helium or the like, factory piping, etc. Although a case is illustrated where one gas supplier 231 is provided, multiple gas suppliers 231 may be provided.

The gas controller 232 is connected between the gas supplier 231 and the multiple gas supply channels 53. The gas controller 232 can control at least one of the flow rate or the pressure of the gas. The gas controller 232 also can further have the function of switching between the supply of the gas and the cutoff of the supply of the gas. For example, the gas controller 232 can be a mass flow controller, a mass flow meter, etc.

As shown in FIG. 16, multiple gas controllers 232 can be provided. For example, the gas controllers 232 can be provided respectively for the multiple regions 101 to 104. Thus, the control of the supplied gas can be performed for each of the multiple regions 101 to 104. In such a case, the gas controllers 232 also can be provided respectively for the multiple gas supply channels 53. Thus, the control of the gas in each of the multiple regions 101 to 104 can be performed precisely. Although a case is illustrated where the multiple gas controllers 232 are provided, one gas controller 232 may be used as long as the supply of the gas is controllable independently for the multiple supply systems.

Here, a vacuum chuck, a mechanical chuck, or the like is used to hold the object W. However, a vacuum chuck cannot be used in an environment depressurized from atmospheric pressure. When a mechanical chuck is used, there is a risk that the object W may be damaged and/or particles may occur. Therefore, for example, an electrostatic chuck is used in a processing apparatus used in semiconductor manufacturing processes, etc.

It is necessary to isolate the processing space of such a processing apparatus from the external environment. Therefore, the processing apparatus 200 can further include a chamber 240. For example, the chamber 240 can have an airtight structure that is capable of maintaining an atmosphere depressurized from atmospheric pressure.

The processing apparatus 200 also can include multiple lift pins and a drive device raising and lowering the multiple lift pins. When the object W is received from a transfer apparatus and when the object W is transferred to the transfer apparatus, the lift pins are raised by the drive device and protrude from the first major surface 11a. When the object W is received from the transfer apparatus and placed on the first major surface 11a, the lift pins are lowered by the drive device and are stored in the interior of the ceramic dielectric substrate 11.

Various apparatuses also can be provided in the processing apparatus 200 according to the content of the processing. For example, a vacuum pump that exhausts the interior of the chamber 240, etc., can be provided. A plasma generator that generates plasma in the interior of the chamber 240 can be provided. A process gas supplier that supplies a process gas to the interior of the chamber 240 can be provided. A heater that heats the object W and/or the process gas also can be provided in the interior of the chamber 240. The apparatuses that are provided in the processing apparatus 200 are not limited to those illustrated. Known technology is applicable to the apparatuses that are provided in the processing apparatus 200; and a detailed description is therefore omitted.

As described above, the processing apparatus 200 according to the embodiment includes the electrostatic chuck 1 described above, the first gas introduction hole (the gas introduction hole 15) provided in the electrostatic chuck 1, and a gas controller (the gas controller 232) that can independently control the gas supplied to the second gas introduction hole (the gas introduction hole 15). According to the processing apparatus 200 according to the embodiment, the pressure of the gas in each region can be set to be appropriate.

Hereinabove, embodiments of the invention are described. However, the invention is not limited to these descriptions. For example, although a configuration in which a Coulomb force is used is illustrated as the electrostatic chuck 1, a configuration that uses a Johnsen-Rahbek force may be used. Appropriate design modifications made by one skilled in the art for the embodiments described above also are within the scope of the invention to the extent that the features of the invention are included. The components included in the embodiments described above can be combined within the limits of technical feasibility; and such combinations are within the scope of the invention to the extent that the features of the invention are included.

What is claimed is:

1. An electrostatic chuck, comprising:
   a base plate; and
   a ceramic dielectric substrate having a substantially circular planar configuration, being provided on the base plate, and having a first major surface exposed externally,
   the first major surface including at least a first region, and a second region adjacent to the first region,
   the first region having a plurality of first grooves, at least one first gas introduction hole, and at least one second groove provided in the first region, the at least one first gas introduction hole being connected to at least one of the plurality of first grooves, the at least one second groove extending in a direction crossing the plurality of first grooves,
   the plurality of first grooves having substantially circular planar configurations and being provided concentrically,
   the second groove being connected to at least two of the first grooves,
   wherein, when projected onto a plane perpendicular to a first direction, at least a portion of the first gas introduction hole overlaps both of the first groove and the second groove at a portion where the first groove and the second groove are connected, the first direction being from the base plate toward the ceramic dielectric substrate, the first region has a first boundary groove at an edge portion thereof proximate the second region, the second region has a second boundary groove at an edge portion thereof proximate the first region, and the first and second boundary grooves are spaced closer together than other, adjacent grooves of the plurality of first grooves.

2. The chuck according to claim 1, wherein at least two of the second grooves are provided in the first region.

3. The chuck according to claim 1, wherein
   the second region further has a plurality of third grooves provided in the second region,
   the second region further has at least one second gas introduction hole connected to at least one of the plurality of third grooves,
   the second region further has at least one fourth groove connected to at least two of the third grooves, the at least one fourth groove extending in a direction crossing the plurality of third grooves,
   the plurality of third grooves has substantially circular planar configurations and is provided concentrically with a center of the plurality of first grooves as a center, and
   when projected onto the plane perpendicular to the first direction, at least a portion of the second gas introduction hole overlaps at least one of the third groove or the fourth groove at a portion where the third groove and the fourth groove are connected.

4. The chuck according to claim 3, wherein at least two of the fourth grooves are provided in the second region.

5. The chuck according to claim 3, wherein
   the second region is provided outward of the first region with respect to a center of the first major surface, and
   when projected onto the plane perpendicular to the first direction, at least a portion of the first gas introduction hole overlaps at least one of the second groove or an outermost first groove among the first grooves in the first region at a portion where the second groove and the outermost first groove are connected, and at least a portion of the second gas introduction hole overlaps at least one of the fourth groove or an innermost third groove among the third grooves in the second region at a portion where the fourth groove and the innermost third groove are connected.

6. The chuck according to claim 3, wherein an angle between a first boundary and a line connecting a center of the first gas introduction hole and a center of the second gas introduction hole is less than 90°, the first boundary being between the first region and the second region.

7. The chuck according to claim 3, wherein an angle between a first boundary and a line connecting a center of the first gas introduction hole and a center of the second gas introduction hole is 90°, the first boundary being between the first region and the second region.

8. The chuck according to claim 7, wherein
   the first region has a lift pin hole provided in the first region, and
   a distance between the lift pin hole and the outermost first groove is greater than a distance between the lift pin hole and the first groove most proximal to the lift pin hole among the plurality of first grooves other than the outermost first groove.

9. The chuck according to claim 1, wherein the ceramic dielectric substrate has a plurality of spaced-apart raised dots extending upwardly from the first major surface and configured to support a workpiece thereon at a level above the first major surface.

10. An electrostatic chuck, comprising:
    a base plate; and
    a ceramic dielectric substrate having a substantially circular planar configuration, being provided on the base plate, and having a first major surface exposed externally,
    the first major surface including at least a first region, and a second region adjacent to the first region,
    the first region having a plurality of first grooves, at least one first gas introduction hole, and at least one second groove provided in the first region, the at least one first gas introduction hole being connected to at least one of the plurality of first grooves, the at least one second groove extending in a direction crossing the plurality of first grooves,
    the plurality of first grooves having substantially circular planar configurations and being provided concentrically, the second groove being connected to at least two of the first grooves, wherein:

at least a portion of the first gas introduction hole overlaps at least one of the first groove or the second groove at a portion where the first groove and the second groove are connected, the first region has a first boundary groove at an edge portion thereof proximate the second region, the second region has a second boundary groove at an edge portion thereof proximate the first region, and the first and second boundary grooves are spaced closer together than other, adjacent grooves of the plurality of first grooves.

11. An electrostatic chuck, comprising:

a base plate; and a ceramic dielectric substrate having a substantially circular planar configuration, being provided on the base plate, the ceramic dielectric substrate having a first major surface exposed externally, and having a plurality of spaced-apart raised dots extending upwardly from the first major surface and configured to support a workpiece thereon at a level above the first major surface, the first major surface including at least a first region, and a second region adjacent to the first region, the first region having a plurality of first grooves, at least one first gas introduction hole, and at least one second groove provided in the first region, the at least one first gas introduction hole being connected to at least one of the plurality of first grooves, the at least one second groove extending in a direction crossing the plurality of first grooves, the plurality of first grooves having substantially circular planar configurations and being provided concentrically, the second groove being connected to at least two of the first grooves, wherein at least a portion of the first gas introduction hole overlaps at least one of the first groove or the second groove at a portion where the first groove and the second groove are connected, the first region has a first boundary groove at an edge portion thereof proximate the second region, the second region has a second boundary groove at an edge portion thereof proximate the first region, and the first and second boundary grooves are spaced closer together than other, adjacent grooves of the plurality of first grooves.

* * * * *